(12) United States Patent
Miyake et al.

(10) Patent No.: US 6,335,535 B1
(45) Date of Patent: Jan. 1, 2002

(54) METHOD FOR IMPLANTING NEGATIVE HYDROGEN ION AND IMPLANTING APPARATUS

(75) Inventors: Koji Miyake; Tsukasa Hayashi; Hajime Kuwahara, all of Kyoto (JP)

(73) Assignee: Nissin Electric Co., LTD, Kyoto (JP)

( * ) Notice: Subject to any disclaimer, the term of this patent is extended or adjusted under 35 U.S.C. 154(b) by 0 days.

(21) Appl. No.: 09/344,341

(22) Filed: Jun. 25, 1999

(30) Foreign Application Priority Data

Jun. 26, 1998 (JP) .......................................... 10-179838
Jun. 30, 1998 (JP) .......................................... 10-183824

(51) Int. Cl.$^7$ ................................................ H05H 1/00
(52) U.S. Cl. ............................ 250/492.21; 250/492.2; 250/492.3; 250/423 R; 250/424; 313/359.1; 313/363.1; 315/111.21; 315/111.61
(58) Field of Search ........................ 250/492.21, 492.2, 250/492.3, 423 R, 424; 313/359.1, 363.1; 315/111.21, 111.61

(56) References Cited

U.S. PATENT DOCUMENTS

| | | | | |
|---|---|---|---|---|
| 4,757,237 A | * | 7/1988 | Hellblom et al. | ....... 315/111.81 |
| 5,783,102 A | * | 7/1998 | Keller | ........................ 216/68 |
| 5,956,581 A | * | 9/1999 | Yamazaki et al. | .......... 438/166 |
| 5,962,083 A | * | 10/1999 | Hatanaka et al. | ........... 427/571 |

FOREIGN PATENT DOCUMENTS

JP    8-97432    4/1996

OTHER PUBLICATIONS

T. Itoga et al.; "Low–Temperature Polysilicon TFT–LCD", Technical Report of Sharp Corporation, vol. 69, pp. 64–68 (1997).

T. Hara et al.; "Delamination of Thin Layer by H$^+$ Implantation in SiC", Lectures of 45–th Relative Association, 29a–K–2, p. 803 (1998).

G.K. Celler; "Laser Crystallization of Thin Si Films on Amorphous Insulating Substrates", Journal of Crystal Growth 63, pp. 429–444 (1983).

M. Bruel et al.; "Smart–Cut: A New Silicon on Insulator Material Technology Based on Hydrogen Implantation and Wafer Bonding", Jpn. J. Appl. Phys. vol. 36, pp. 1636–1641 (1997).

X. Lu et al.; "Ion–Cut Silicon–on–Insulator Fabrication with Plasma Immersion Ion Implantation", Appl. Phys. Lett. 71 (19), pp. 2767–2769 (1997).

J. Ishikawa; "Ion Source Engineering", Ionics, pp. 34–35 (1986).

S. Samukawa; "Pulse–Time–Modulated Plasma and its Applications for Advanced Plasma Processing", Applied Physics, vol. 66, No. 6–issue, pp. 550–558 (1997).

M. B. Hopkins et al.; "Enhanced Vol. Production of Negative Ions in the Post Discharge of a Multicusp Hydrogen Discharge", J. Appl. Phys. 70 (4), pp. 2009–2014 (1991).

J. Ishikawa; "Ion Source Engineering", Ionics, pp. 486–492 (1986).

T. Tomita et al.; "Extraction Properties of Oxygen and Fluorine Negative Ions from RF Plasma–Sputter–Type Heavy Negative–Ion Source", Proc. Beams 1995 Tokyo, pp. 191–194 (1995).

* cited by examiner

*Primary Examiner*—Bruce Anderson
*Assistant Examiner*—Nikita Wells
(74) *Attorney, Agent, or Firm*—Finnegan, Henderson, Farabow Garrett & Dunner, L.L.P.

(57) ABSTRACT

A method for implanting negative hydrogen ions includes the following steps. Plasma containing hydrogen is generated. Negative hydrogen ions are generated in the plasma. An electric field is formed between the plasma and a substrate. Negative hydrogen ions from the plasma is accelerated by using the electric field so as to implant negative hydrogen ions into a predetermined depth of a substrate.

31 Claims, 13 Drawing Sheets

METHOD FOR IMPLANTING NEGATIVE HYDROGEN ION AND IMPLANTING APPARATUS

DESCRIPTION OF THE INVENTION

1. Field of the Invention

The present invention relates to a method for implanting hydrogen ions to a predetermined depth of the overall body of a semiconducting substrate, such as silicon (Si), an insulating substrate made of SiC, glass, or plastic, or a metal substrate. This invention further relates to an implanting apparatus.

2. Background of the Invention

Purposes for implanting hydrogen ions into a substrate fall into two categories. One of these types is directed to forming a weak porous layer (a void layer) in the substrate by implanting hydrogen ions to shear the substrate. The other type is directed to improving the physical properties of a required object. These various purposes for performing of implantation of hydrogen will now be described in greater detail.

1. Implantation of Hydrogen Ions for the Purpose of Manufacturing SOI Substrate

A Silicon On Insulator (SOI) substrate is a substrate having single crystal Si on an insulating layer thereof. A portion of the SOI substrate has a thick insulating substrate on which Si is placed (a Si/insulating substrate). For example, a structure is known in which a thin Si film is formed on sapphire. However, hetero growth on different crystal suffers from frequent crystal defects. No cleavage can be used and, thus, the cost cannot be reduced. Therefore, a major portion of SOI substrates have a triple-layer structure, the overall body of which is made of Si, and in which a thin insulating layer and single crystal Si exist (Si/insulating layer/Si substrate). The insulating layer is made Of $SiO_2$. That is, the triple-layer structure is $Si/SiO_2/Si$ substrate.

The Si wafer is a low-cost wafer and those having a high quality can easily be obtained. Since the SOI substrate has a structure in which Si is formed on Si, the lattice constant is the same and the number of defects is small. Since cleavage exists, separation of the device can easily be performed. To manufacture the foregoing substrate, an inner porous layer is formed by implanting hydrogen ions. Then, another Si wafer is bonded to perform shearing at the porous layer, and then the surface is polished so that the SOI is manufactured. The foregoing method will be described in greater detail below.

2. Implantation of Hydrogen Ions to Manufacture Single Crystal Si/Glass Substrate A substrate for a liquid crystal device incorporates a multiplicity of thin-film transistors manufactured on amorphous silicon (a-Si) on a glass plate. Although the foregoing structure is a main portion of the foregoing substrate, the mobility of carriers of a-Si is too low to realize a high speed operation. At present, substrates for liquid crystal devices having the highest performance incorporate a thin polycrystal silicon film (p-Si) formed on a glass substrate. Since mobility of electrons is superior to that of a-Si, high speed operation is realized. The foregoing structure has been suggested in, for example, Technical Report of Sharp Corporation "Low-Temperature Polysilicon TFT-LCD", Vol. 69, pp. 64 (1997), written by Takashi Itoga, Masataka Ito and Hiroshi Takato.

However, a satisfactory result has not been realized from the foregoing technique. The polycrystal has a multiplicity of grain boundaries, causing scattering of electrons to occur frequently. As compared with single crystal Si, the mobility of electrons is unsatisfactory. Since a multiplicity of grain boundary levels exist in the grain boundary of the polysilicon, electrons are scattered. Therefore, an attempt has been made to decrease the grain boundary levels by implanting hydrogen ions. For example, a suggestion has been made in Japanese Patent Laid-Open No. 8-97432 entitled "Method of Manufacturing Thin-Film Semiconductor Apparatus" filed by Nobuaki Suzuji. According to the foregoing disclosure, when annealing is performed by implanting hydrogen ions, hydrogen terminates Si in the grain boundaries. Thus, the levels can be decreased and the mobility is, therefore, raised.

The polycrystal thin Si film, however, has another problem as well as the low mobility. Since electric currents easily flow along the grain boundary of the polycrystal Si, a great leak current flows between the source and the drain. Therefore, a complicated LDD structure is required. As a result, the SOG (System On Glass) has no possibility of realization. The SOI is used such that hydrogen is implanted into Si to form a porous layer so as to be bonded to a glass plate. Then, a Si substrate is sheared from the porous layer to bond the single crystal thin Si film to the glass substrate. Since the substrate is made of glass in place of Si, a void cutting method can be employed which is similar to the method for manufacturing SOI. Therefore, a method may also be employed in which hydrogen is implanted into a Si wafer to form a weak layer so as to be bonded to a glass plate. Then, the Si layer is thinly separated so that the single crystal Si/oxide/glass layer structure is manufactured.

3. Modification of Solar Cell

At present, solar cells using silicon for electric power mainly use monocrystalline silicon, polycrystalline silicon, amorphous silicon or the like. The amorphous silicon is cheap but its photoelectric conversion efficiency is low (about 8%). On the other hand, the photoelectric conversion efficiency of the monocrystalline and polycrystalline silicon can be 15 to 20%. Accordingly, the latter is mainly used.

The monocrystalline or polycrystalline silicon solar cell is cut similarly to a semiconductor substrate. Accordingly, the thickness of the monocrystalline or polycrystalline silicon solar cell should be 500 $\mu$m to 600 $\mu$m per one sheet. Most of the sheet is wasteful. In order to obtain the photoelectric conversion efficiency of 15 to 20%, it is sufficient that the thickness is several $\mu$m to 20 $\mu$m. Therefore, the void cut method by hydrogen ion implantation is used. The following two methods are generally used for this purpose:

(1) Hydrogen atoms are implanted to the depth of several $\mu$m by the acceleration energy of several hundred KeV to several MeV to perform the void cut.

(2) Hydrogen atoms are implanted to the depth of several tens nm to several $\mu$m to perform the void cut. The insufficient film thickness is made up by expitaxial growing before or after the void cut.

4. Implanting Hydrogen Ions into SiC

A method has been suggested with which a similar void cutting method is employed to manufacture a thin SiC film. The SiC is a semiconductor capable of resisting high temperature and permitted to be used for another purpose. A suggestion has been made about a method of manufacturing a thin SiC film by employing a method similar to that for manufacturing the SOI by forming a porous layer into which hydrogen ions have been implanted and by performing delamination. See "Thin-Film Delamination by Implanting $H^+$ and Application of Thin-film delamination to SiC", previous thesis for associated lectures of 45-th relative association, 29a-K-2, pp. 803 (1998). However, a substrate having satisfactory qualities has not been manufactured yet. While a variety of attempts have been made, no device has been realized.

As known, the Si-On-Insulator substrate (a so-called SOI substrate) incorporating a single crystal Si semiconductor layer formed on an insulating material has a variety of advantages, for example, high density integration and capability of manufacturing a high-speed device as compared with a usual bulk Si substrate. Therefore, much research and development has been carried out in a multiplicity of facilities. The foregoing advantages have been disclosed in, for example, Special Issue: "Single-crystal silicon on non-single-crystal insulators"; edited by G. W. Cullen, Journal of Crystal Growth, vol. 63, No. 3, pp. 429–590 (1983), which notes that two methods may be available to manufacture the SOI substrate. One is a method (SIMOX) for forming an oxide silicon layer by directly implanting oxygen ions. Another method is a bonding manufacturing method called the void cutting method or a smart cutting method by performing implantation of hydrogen ions. Since the present invention relates to a method for implanting hydrogen ions into the wafer, the smart cutting method can be improved.

A method of manufacturing the SOI substrate by the smart cutting method has been disclosed in, for example, "Smart-Cut: A new silicon on insulator material technology based on hydrogen implantation and wafer bonding"; Jpn. J Appl. Phys Vol. 36 (1997) pp. 1636–1641. A multiplicity of other documents have been issued. The methods will briefly be described below. The surface of a first Si substrate is oxidized so that a $SiO_2$ film is formed. Then, hydrogen ions with energies of about 100 keV are implanted in a density of $1 \times 10^{14}/cm^2$ or greater. Thus, a porous layer having great porosity is formed at a depth of about 0.2 $\mu$m to about 0.5 $\mu$m. Heat treatment is performed so that damage to the surface of the Si layer caused by the implantation is recovered. Then, the first Si substrate is bonded. The insulating layer may be provided with a second Si wafer. Then, shearing force is imparted in the vertical direction so that the first substrate is cut at the porous layer. The surface is then polished so that the SOI substrate is manufactured.

The gas to be injected may be rare gas or nitrogen gas as an alternative to the hydrogen gas. The hydrogen gas is the most preferred gas. The reason for this lies in that hydrogen having a small mass can be implanted to a considerable depth. Moreover, hydrogen does not considerably damage the surface of the Si layer.

The most usual method for implanting hydrogen ions is a method of using an ion implanting apparatus for implanting impurities of B or P. Prior art FIG. 1 shows a method for implanting hydrogen ions by using a representative ion implanting apparatus.

Excitation of plasma is performed by using a thermal filament, microwaves or high frequency. That is, an apparatus using excitation of the filament is employed. A chamber 1, having pressure which can be reduced to a reasonable level of vacuum, is provided with a filament 2. A terminal of the filament 2 leads to the outside through an insulating member 5. A DC filament power source 3 is connected to the two ends of the terminal. The chamber 1 has a gas inlet opening 4 to allow the introduction of hydrogen gas. An arc power source 6 (Vak) is connected between the chamber 1 and the filament 2. An acceleration power source 7 (Vacc) is placed between the negative electrode of the arc power source 6 and a ground. The potential of the chamber 1 is Vacc+Vak.

Three electrodes each of which is provided with a hole are provided on the outside of outlet opening 8 of the chamber 1 so that the holes in the electrodes are aligned. The electrodes are an accelerating electrode 9, a decelerating electrode 10 and a ground electrode 11. The positive electrode of the acceleration power source 7 is connected to the acceleration electrode 9 through a resistor 13. A decelerating power source 12 is connected to the decelerating electrode 10. A quarter circular-arc mass-separating magnet 14 is disposed on an extension of the chamber outlet opening 8 and the electrodes 9, 10 and 11. An ion beam 15 emitted from the chamber 1 is introduced into the mass-separating magnet 14 through the inlet opening 16 so that a curved trace is drawn by the magnetic field. Then, the ion beam 15 is discharged from an outlet opening 17. Since the trace has been adjusted by the mass and energy, $H^+$ ions (which contain only one atom) are allowed to pass through a central trace 26 so as to pass through a slit plate 18. On the other hand, $H_2^+$ ions (which, containing two atoms, are more massive) draw an eccentric trace 27, and then collide with the wall of the mass-separating magnet 14 and the slit. Thus, the $H_2^+$ ions are eliminated. $H^+$ ions are allowed to pass through the slit plate 18, and then scanned laterally by a scanning mechanism 22 consisting of opposite electrodes 19 and 20 and a variable power source 21. A scanning beam 23 is injected to a Si wafer 24 placed on a susceptor 25.

A plurality of types of positive ions are generated in the hydrogen plasma. If plural types of positive hydrogen ions are implanted, a plurality of hydrogen-implanted layers are undesirably formed. Therefore, only one type of positive hydrogen ions must be selected and implanted in a substrate. To perform the selective implantation, mass separation must be performed. To perform the mass separation, the diameter of the beam must be reduced. That is, a beam considerably thinner than the diameter of the wafer is required. Since the beam has a diameter smaller than that of the wafer, the beam cannot implant ions into the entire surface of the wafer in one operation. Therefore, a scanning mechanism for swinging the beam is required. The presence of the mass separation structure and the scanning mechanism raises a variety of problems.

A method using the ion implanting apparatus to perform mass separation, scanning and implantation of hydrogen ion beam is similar to a conventional impurity-ion implanting apparatus. As can easily be appreciated, such an apparatus is costly and complicated. Since a magnet having a large height must be provided, a great area is required for installation. Since scanning using the beam must be performed, a very long processing time is required for each wafer. Therefore, the throughput is too low to reduce the cost of each SOI substrate. The foregoing fact is a reason why the SOI substrates, although recognized to have advantages, are not widely used.

In recent years, another method has been suggested in which a substrate is exposed to hydrogen plasma and negative pulse voltages are periodically applied to the substrate so as to implant hydrogen ions to the overall surface of the substrate. The foregoing method has been disclosed in "Ion-cut silicon-on-insulating fabrication with plasma immersion ion implantation": edited by Xiang Lu S. Sundar Kumar Iyer et. al, Appl. Phys. Lett.71 (19), 1997.

FIG. 9 shows the foregoing technique. Hydrogen gas is supplied into a plasma chamber 200 through a raw-material gas inlet opening 202. Microwaves 204 generated by a magnetron (not shown) and transmitted in a wave-guide pipe 203 are supplied into the plasma chamber 200. A Si wafer 207 is placed on a susceptor 208 in the plasma chamber 200. The susceptor 208 is supported by a shaft 209. The shaft 209 is negatively biased by a negative bias power source 220.

The wafer 207 is contacted with plasma 206. When the wafer is negatively biased, positive hydrogen ions $H^+$ and $H_2^+$ are implanted to the overall surface of the wafer in one operation.

The foregoing method does not utilize mass separation and therefore the apparatus can be simplified. However, since the mass separating mechanism is not provided, all positive ions ($H_2^+$ and $H^+$) in the plasma are undesirably introduced into the wafer. As a result, two porous layers each having great porosity are undesirably formed. In this case, smart cutting of the wafer cannot satisfactorily be performed. Since mass of the molecule ($H_2$) and that of the atom (H) are different from each other by two times, light $H^+$ ions are deeply implanted about two times the depth to which heavy $H_2^+$ are implanted when the same accelerated energy is added. A first layer is formed by $H_2^+$, while a porous layer which is a second layer is formed by $H^+$.

Cutting at the second layer formed by the $H^+$ ions must be avoided. The reason for this lies in that the first layer is left on the SOI substrate when the SOI substrate is manufactured by bonding another wafer. If separation of the overall surface of the first layer (the porous layer made of $H_2^+$) more adjacent to the surface is permitted, no problem arises. If a portion cut at the second layer exists, a surface defect occurs, causing the manufacturing yield to considerably deteriorate.

In the foregoing document, the foregoing problem is overcome by controlling the state of the plasma by optimizing the gas flow rate and supplied electric power such that the ratio of positive ions in the plasma is made to be $H_2^+/H^+=90:10$. That is, $H_2^+$ is implanted at a higher ratio. Since the quantity of the $H^+$ ions is small, relative to the quantity of $H^+$ ions, the thickness of the first layer is reduced. Thus, a contrivance is employed to cause separation to easily occur at the first layer.

However, complete removal of $H^+$ cannot be performed. Therefore, there is a risk that separation at the second layer will occur. The conventional method cannot generate either the $H_2^+$ ions or $H^+$ ions in the plasma with priority to a degree that the other ions can be ignored. If a plasma parameter is shifted even in a small quantity, there is a risk that the ratio of the positive ions $H_2^+:H^+$ will change. In particular, there is a critical risk that the safety of the manufacturing apparatus cannot be ensured.

When $H_2^+$ ions are implanted with priority to form the porous layer, the voltage required is about two times the voltage required for $H^+$ to be implanted to the same depth. Therefore, the degree of technical difficulty involved with providing a power source for applying the plasma voltage is raised. Moreover, the cost of such a method is increased. Therefore, some sort of mass separating mechanism is desirable.

A critical problem of the first method is a fact that mass separation is required. In the plasma, the types of positive hydrogen ions include $H^+$ and $H_2^+$ ions as described above. If more than one type is implanted, the porous layer is undesirably formed into a multilayered structure. To select only one type of the ion beam, the ion implanting apparatus shown in FIG. 1 must be provided with a mass separating system. Since a large magnet is required, the size and the cost of the apparatus cannot be reduced. Since a thick beam cannot be sputtered, the diameter of the ion beam must be reduced. Because of this reduction in the diameter of the ion beam, ions cannot be implanted to the overall surface of the wafer in one operation. Therefore, a scanning mechanism must be provided to scan the overall surface of the wafer with the beam.

Attempts to solve the foregoing problem by controlling the plasma parameter utilize the method (see FIG. 9) of exposing the substrate to the hydrogen plasma and applying negative plasma voltage to the substrate so as to implant hydrogen ions. However, the foregoing method is still problematic because plural types of positive hydrogen ions are implanted.

SUMMARY OF THE INVENTION

It is a first object of the present invention to provide a method and apparatus for implanting hydrogen ions into a semiconductor substrate, an insulating substrate or a metal substrate such that the ions generated from hydrogen are limited to one type.

It is another object of the present invention is to provide an apparatus for implanting hydrogen ions such that the type of generated ions is limited to one type, thereby removing the need to perform the mass separation and reducing the cost and the required installing area.

It is another object of the present invention is to provide an apparatus for implanting hydrogen ions in which scanning is not required because generated ions are limited to one type and thus a high throughput is realized.

As described above, positive hydrogen ions include two types, $H^+$ and $H_2^+$. Therefore, only one type of ion cannot easily be generated at a ratio of 80% or higher. If the mass separation is performed, the size and the cost of the apparatus cannot be reduced. What is worse, the throughput is unsatisfactorily low. Therefore, the present invention does not employ the foregoing method.

According to the present invention, a method for implanting negative hydrogen ions comprises the steps of: generating plasma containing hydrogen; generating negative hydrogen ions in the plasma; forming an electric field between the plasma and a substrate; and accelerating negative hydrogen ions from the plasma by using the electric field so as to implant negative hydrogen ions into a predetermined depth of a substrate.

According to the present invention, an apparatus for implanting negative hydrogen ions comprises: hydrogen generating means for generating plasma containing hydrogen; negative hydrogen ions generating means for generating negative hydrogen ions in the plasma; and electric field forming means for forming an electric field between the plasma and a substrate; wherein negative hydrogen ions from the plasma are accelerated by using the electric field so as to implant negative hydrogen ions into a predetermined depth of a substrate.

DETAILED DESCRIPTION OF THE INVENTION

Figure 1:
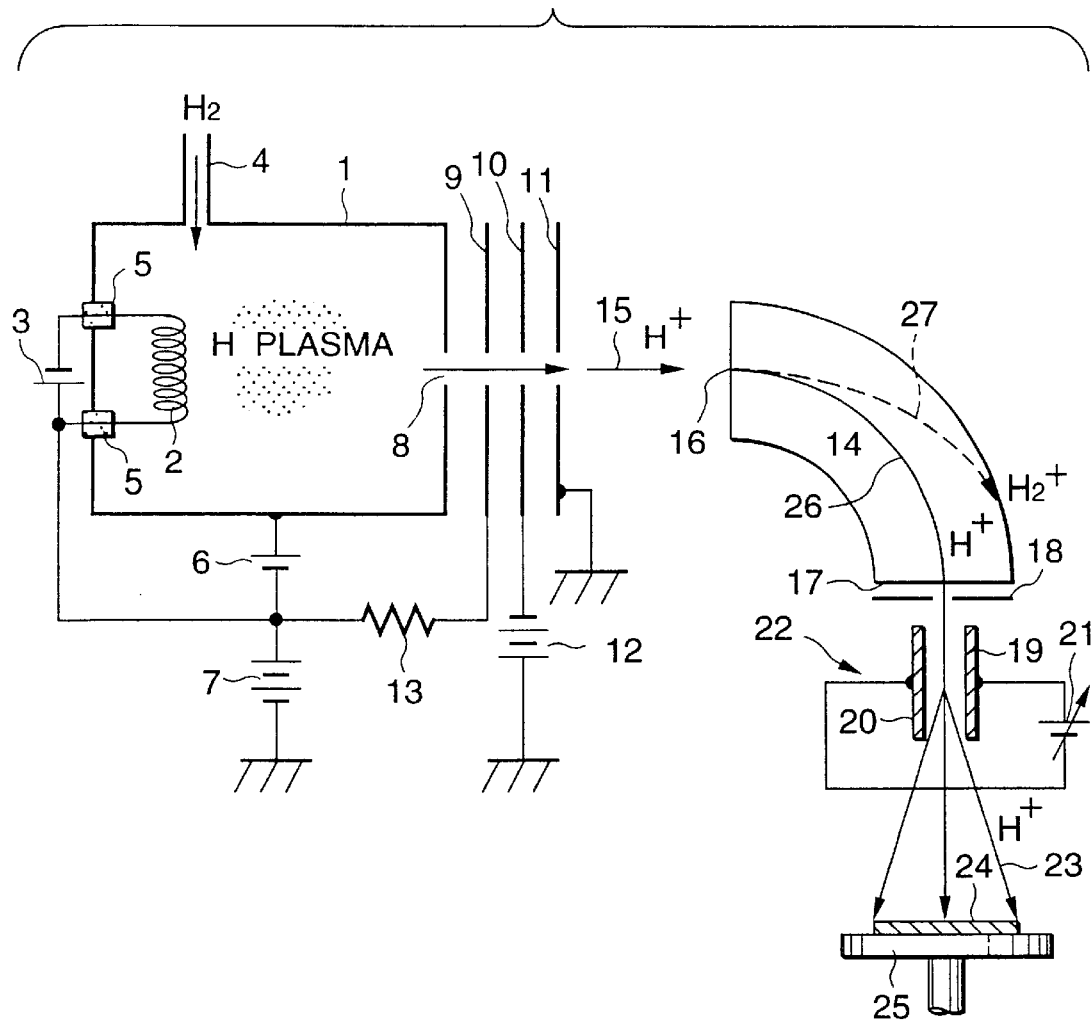
FIG. 1 is a schematic cross sectional view showing a conventional apparatus for implanting positive hydrogen ions into a Si wafer.

The present invention will be described in detail as follows:

In the present invention, negative hydrogen ions H$^-$ are employed in place of positive ions. Only H$^-$ is a stable negative hydrogen ion. If negative molecule ions, such as H$_2^-$ are generated, the foregoing ions have short lives of several ns to tens of ns, after which the ions are quickly dissociated into H and H$^-$. Therefore, the negative hydrogen ions are H$^-$ ions at a ratio of 100%. The monopolization of H$^-$ in the negative hydrogen ions have been disclosed in, for example, "Ion Source Engineering", written by Junzo Ishikawa, published from Ionics, pp. 34 to 35.

The present invention uses this significant monopolization of H$^-$ in negative ions. A substrate made of Si, a dielectric substrate or a substrate made of glass, which must be processed, is placed in a plasma chamber so as to be brought into contact with plasma. Then, positive voltage is applied in a pulsing manner to the substrate which must be processed and the suscepter so that H$^-$ ions are collectively implanted into the substrate. A thin discontinuous potential layer called a sheath exists between the plasma and the substrate. The accelerated voltage is applied to the sheath so that H$^-$ are accelerated.

Since other negative hydrogen ions do not exist, mass separation is not required. Since the substrate is placed in the plasma chamber and then the substrate is brought into contact with the plasma, beam scanning is not required. Since collective implantation is performed, a high throughput can be realized. The foregoing facts are essential features of the present invention.

Since only one-atom and monovalent ions H$^-$ exist in the negative hydrogen ions, mass separation is not required. Therefore, a large and heavy mass separating magnet is not required. Thus, the size of the apparatus can be reduced and the area required to install the apparatus can be reduced. Since no magnet is required, cost of the apparatus is also reduced.

Since mass separation is not required, the necessity of forming a thin ion beam can be eliminated. The substrate is directly placed in the plasma such that the substrate is contacted with the plasma. Then, positive voltage is, in a pulsing manner, applied to implant negative hydrogen ions to the substrate. Since beam scanning is not performed, the cost of the apparatus can be reduced in an amount corresponding to the scanning mechanism. Since the scanning mechanism is not required and, therefore, no scanning distance is required, the area required to install the apparatus can be reduced. Since implantation of ions can be performed, collectively, the time required to complete the implantation process can be shortened significantly. As a result, the throughput can considerably be improved. Moreover, the cost for manufacturing a SiSOI substrate by the void cutting method can be reduced.

The use of negative hydrogen ion beams presents a problem which must be overcome. That is, a method of generating negative hydrogen ions in a large quantity must be realized. The reason why all of the conventional techniques have employed positive hydrogen ions in implantation is due to the fact that positive ions can be generated easily. Negative ions, on the other hand, cannot be generated easily. Since electrically neutral conditions must exist, the number of positive ions=the number of electrons+negative ions. In the plasma, the number of negative ions is always smaller than that of positive ions. Since both of the negative ions and electrons are negatively-charged particles, there arises a problem in that electrons are also ejected when negative ions are ejected when the ion source is in a negative state. When electrons are implanted into the substrate, the required ion currents are wasted. Moreover, there arises a problem in that the substrate is undesirably heated by the electrons. A major portion of the ion implanting apparatuses use positive ions because positive ions can easily be generated and mixture of electrons can be prevented.

The foregoing difficulty in generating negative ions can be solved in various ways. One solution is a method of rapidly quenching electrons while the neutral state is being maintained in the plasma so as to temporarily increase negative ions. If conversion to monovalent ions is performed, the number of electrons+the number of negative ions=the number of positive ions. Therefore, when the number of electrons is temporarily moved closer to zero, the number of the negative ions can be made closer to the number of the positive ions. When a plasma exciting means is interrupted when the plasma is being turned on, the temperatures of electrons are rapidly lowered. Thus, the number of low-energy electrons is increased.

These low-energy electrons, having large cross sectional areas at a time of collision and bonding, easily collide with neutral atoms and molecules. A low-energy electron which collides with a neutral hydrogen atom is captured by the neutral hydrogen atom so that monovalent $H^-$ is produced. Collision with a neutral hydrogen molecule results in fission of the molecule into two atoms which are given charges. Thus, a neutral atom and a negative ion $H^-$ are generated. When the plasma is quenched as described above, electrons are rapidly decreased and the negative ions are increased. The foregoing phenomenon occurs temporarily, after which both the positive ions and the negative ions start decreasing. In the foregoing short period, bias voltage is applied to the substrate (the wafer) and the suscepter to implant negative ions into the wafer.

Since the implantation is performed in a short period, implantation must be repeated. Therefore, the plasma is turned on/off in a pulsing manner, and then the positive voltage bias is applied to the wafer and the suscepter in a pulsing manner after a predetermined time delay. Although the quantity of ions implanted per operation is small, a required dose can be realized as a result of the repeated implanting operations. The foregoing method is called a "post-turning-off positive pulse method".

Another method for densely generating negative ions is known. Electrons in the plasma have high temperatures and a high energy of tens of eV. Therefore, bonding with neutral atoms is not easily permitted. Low-speed electrons having energies of about 0.1 eV to about 0.01 eV can easily be bonded to neutral atoms and allowed to generate negative ions. Therefore, this method has a step of lowering the electron energy to about 0.1 eV or lower to enlarge the cross sectional areas of collision and bonding with neutral atoms and neutral molecules. This method is called an "energy filter method" and is a method of raising the density of negative ions from viewpoints of time and space. The foregoing method can be employed together with the post-turning-off positive pulse method in one apparatus.

Another known method of generating negative ions uses the fact that Cesium (Cs) has a low work function. In this method, Cs is first allowed to adhere to a target that is positively biased, and then neutral atoms and molecules are collided with the Cs. Thus, the Cs atoms reach the neutral state and negative ions are generated. Although Cs is generated as a positive ion, Cs is returned to the neutral state because electrons are transmitted from the target. The foregoing method uses the fact that Cs easily releases electrons (has a low work function). Note that rubidium (Rb) may be substituted for Cs. The foregoing method can be employed together with the post-turning-off positive pulse method.

There are various known methods of generating plasma, including arc discharge using a filament, high-frequency discharge between parallel and flat electrodes, DC discharge, microwave discharge and generation of sputtering negative ions. Ion sources exist which correspond to the foregoing exciting means. The present invention may be adapted to any one of the post-turning-off positive pulse method sources.

Although hydrogen gas is a most suitable raw material gas, the raw material gas is not limited to this. As an alternative to this, hydrogen+rare gas may be employed. For example, rare gases, such as helium gas and argon gas may be used. The foregoing gases are stable in a plasma state and permit generation of negative hydrogen ions when the rare gas and hydrogen collide with each other. Therefore, the density of negative ions is raised by the presence of rare gas.

As an alternative to this, gas of a type containing hydrogen, such as $SiH_4$ or $CH_4$, may be employed to serve as the raw material gas. When $SiH_4$ is employed, $Si_xH_y^-$ ions are generated in addition to $H^-$. The additional ions, which are very heavy, are only implanted to positions adjacent to the surface of the substrate. Therefore, the foregoing ions can easily be removed by polishing.

In the present invention, positive voltage is applied to a wafer placed in contact with plasma, followed by implanting negative hydrogen ions $H^-$ into a Si substrate, a glass substrate or a dielectric substrate. Since the only negative hydrogen ion present in the plasma is $H^-$, mass separation is not required. Since the necessity of reducing the diameter of the beam for the purpose of performing the mass separation can be eliminated, no scanning apparatus is required. Therefore, the apparatus can be simplified, size reduction is permitted, and the throughput can be improved. A method of generating negative ions, which cannot easily be generated, will now be described in greater detail.

1 Post-Turning-Off Positive Pulse Method
(Post-Turning-Off Negative Ion Beam Method)

Turning of the plasma on is performed in a pulsing manner. Immediately after the plasma has been turned off, positive voltage is applied to the substrate (the wafer) in a pulsing manner so that negative ions are implanted (the method is a method of turning plasma on in the pulsing manner and a predetermined voltage is applied to a leading electrode system immediately after the plasma has been turned off so that negative ions are implanted).

When the plasma generating means is turned on, plasma containing hydrogen is generated in the plasma generating chamber. Then, the plasma generating means is turned off. Thus, the temperatures of electrons in the plasma are rapidly lowered from tens of eV to 5 to 7 eV in several $\mu$sec. On the other hand, the densities of electrons and positive and negative ions are not substantially changed in the foregoing period. In the plasma, low-energy electrons become predominant. Since low-speed electrons and hydrogen molecules undergo dissociative adhesion, the possibility of generation of negative hydrogen ions can rapidly be raised. The foregoing fact can easily be expressed by equations of "$e^-+H_2 \rightarrow H^-+H$" and "$e^-+H \rightarrow H^-$." Since the foregoing adhesion takes place, the density of neutral atoms is rapidly raised immediately after the plasma generating means has been turned off. When a period of time of 20 $\mu$sec to 30 $\mu$sec has elapsed, electrons, which are relatively light, are rapidly diffused and, therefore, quenched. Thus, the density is lowered. Positive and negative ions, having relatively larger masses are not substantially quenched. Therefore, exceptional plasma is generated which has considerably low electron density and in which the positive and negative ions persist in the plasma. The foregoing phenomenon has been disclosed in, for example, "Pulse Modulated Plasma", Seiji Samukawa, Applied Physics, Vol. 66, No. 6-issue, pp. 550–558 (1997); and M. B. Hopkins, M. Bacal & W. G. Graham, "Enhanced volume production of negative ions in the post discharge of a multicusp hydrogen charge", J. appl. Phys. 70 (4), pp. 2009–2014 (1991)".

The former document discloses plasma of chlorine and argon. The latter document discloses results of examination of hydrogen plasma. The present invention uses a modification of the foregoing technique. A state in which the density of negative ions is high is realized in a short period of time after the plasma has been turned off. The present invention has the step of applying positive pulse voltage to the substrate, that is, the suscepter, at the instant when the exceptional plasma (the number of positive ions=the number of negative ions) is formed. As a result, negative hydrogen ions ($H^-$) are implanted to the entire surface of the Si substrate.

2. Energy Filter Method

The plasma chamber is divided into two chambers. Raw material gas is introduced into a first plasma chamber so as to be excited so that plasma is generated. In the second plasma chamber, a wafer and a suscepter are disposed. An energy filter created by a magnetic field is formed between the two plasma chambers. In the first plasma chamber, generation of plasma is performed vigorously so that electrons have high energies. The energy filter inhibits penetration of high-energy electrons into the second chamber. In this second plasma chamber, a large quantity of low-energy electrons exist. The low-energy electrons have great cross sectional areas of collision and therefore bond with neutral molecules and atoms. The low-energy electrons are bonded to neutral atoms so that the neutral atoms are converted into negative $H^-$ ions. After the quantity of low-energy electrons has been reduced as described above, low-energy electrons are introduced from the first plasma chamber. The energy filter has selectivity with respect to electron energy. Note that free transmission of neutral atoms and molecules is permitted. The foregoing permission is realized by forming a magnetic field having an intensity of tens of Gauss. The foregoing magnetic field can be formed by disposing permanent magnets opposite to each other. As an alternative to this, the magnetic field can be formed by passing electric currents in a plurality of parallel conductive rods.

3. Cs method

The Cs method is a method which has widely been used to serve as a negative ion source. When Cs is adsorbed to the surface of a metal material, Cs has an effect of lowering the work function of the surface of the metal material. Since the work function is lowered, easy discharge of electrons is permitted. When the metal material is negatively biased, the metal material serves as a material for discharging electrons. When hydrogen molecules and positive hydrogen ions collide with the Cs, electrons are supplied to the hydrogen molecules. Thus, negative hydrogen ions are generated. Cs in a solid state is accommodated in the evaporation source, and then Cs is heated and vaporized so as to be introduced to the surface of the metal material. As an alternative to Cs, rubidium (Rb), potassium (K) or barium (Ba) may be employed.

Embodiment 1 (Using Increase in Negative Ions Immediately After Turning of Plasma Off)

Figure 2:
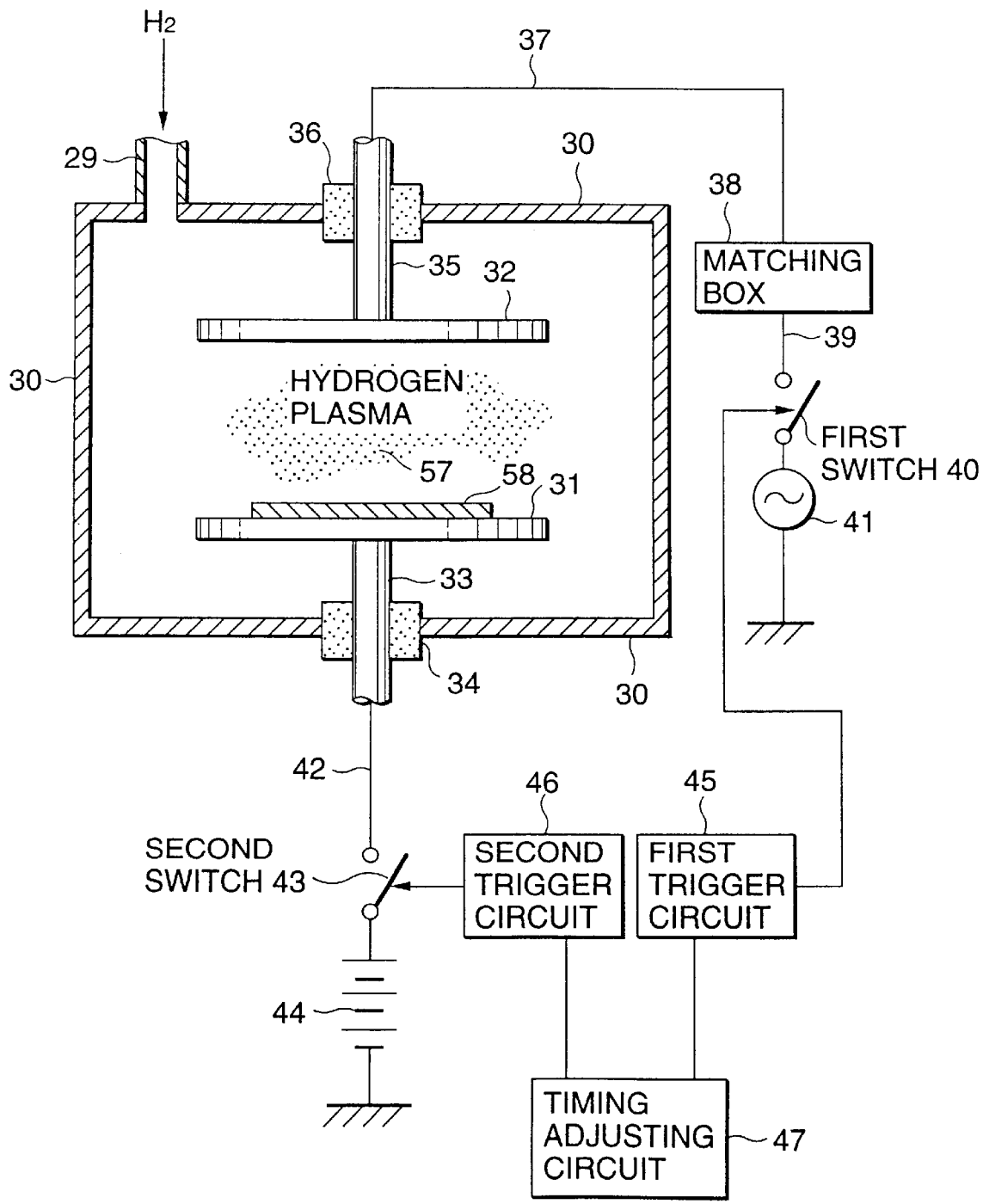
FIG. 2 is a cross sectional view according to a first embodiment of the present invention and structured such that hydrogen plasma generated by excitation using high frequency and positive bias voltage is applied in a period of time in which negative ions are temporarily increased after supply of high-frequency power has been interrupted so as to implant negative hydrogen ions to a Si wafer.

Referring to FIG. 2, a first embodiment will now be described. A chamber 30 having a raw-material-gas introducing opening 29 is an apparatus for generating plasma by excitation using a high frequency. A suscepter electrode 31 is disposed in the lower portion of the chamber 30, while an opposite electrode 32 is disposed in the upper portion. The suscepter electrode 31 is supported by a shaft 33. The shaft 33 is insulated from the chamber 30 by an insulating member 34. An opposite electrode 32 of parallel and flat electrodes 31 and 32 is connected to a 13.56 MHz high-frequency power source 41 through an electric line 37, a matching box 38, an electric line 39 and a first switch 40. The high-frequency power source 41 is triggered by a first trigger circuit 45 so as to periodically be turned on/off.

A Si substrate 58 is mounted on the suscepter electrode 31 of the parallel and flat electrodes 31 and 32. A shaft 33 connected to the suscepter electrode 31 is supported by the chamber 30 through the insulating member 34. The shaft 33 is connected to the positive electrode of a positive bias power source 44 through an electric line 42 and a second switch 43. Note that the foregoing power source is the positive bias power source, that is, it is not the negative bias power source. The second switch 43 is periodically switched on/off by a second trigger circuit 46.

Figure 3A:
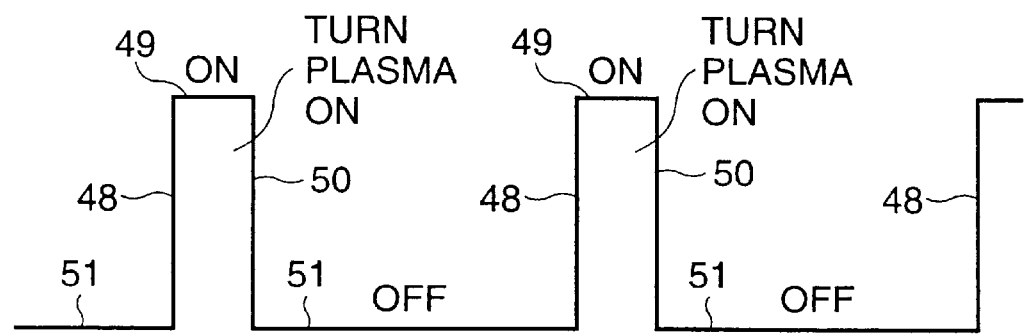
FIGS. 3A and 3B are graphs showing the waveform of pulses to illustrate timing at which high frequency power is supplied and timing at which positive bias voltage is applied to the wafer according to the first embodiment shown in FIG. 2.
Figure 3B:
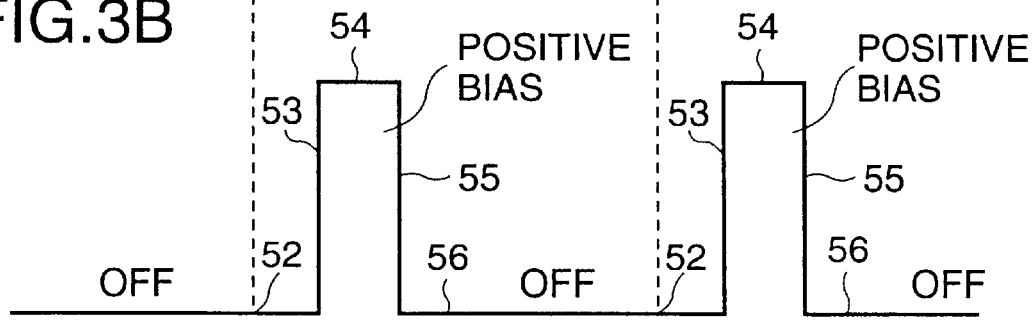

The timing adjusting circuit 47 turns on/off the first and second trigger circuits 45 and 46 with a predetermined time delay, as shown in FIGS. 3A and 3B. The first switch for turning plasma on is switched on/off in a short period in a pulsing manner. Immediately after this, the second switch 43 for applying positive bias voltage to the suscepter electrode 31 and the wafer 58 is switched on/off in a short period. The reason for this is as follows.

Hydrogen gas is introduced into the plasma generating chamber 30. The first trigger circuit 45 switches the first switch 40 on (first transition 48 of the pulse). A high frequency power is applied to the opposite electrode 32 and the suscepter electrode 31. Thus, glow discharge takes place between the electrodes so that hydrogen plasma is generated. Electrons in the plasma have kinetic energies of tens of eV. The foregoing state is a state in which plasma has been turned on when the high frequency power 49 has been turned on shown in FIGS. 3A and 3B.

When the first trigger circuit 45 has been turned off (fall 50), the first switch 40 is switched off. Thus, quenching of the plasma is started. The temperatures of electrons are lowered, causing high energy electrons each having energies of tens of eV in the plasma to rapidly be quenched in about several $\mu$sec. Instantaneously, the electrons lose energy to a state of low energy of about several eV. If the energy is low, the speed is low and, therefore, the collision cross sectional area with hydrogen atoms is considerably enlarged. That is, collision with hydrogen easily occurs. The low-energy electrons are allowed to dissociatively adhere to hydrogen molecules so that $H^-$ is generated. Therefore, the density of $H^-$ is rapidly raised immediately after the trigger circuit 45 has been turned off 50. When the gas pressure is raised and the supplied microwave power is enlarged to intensify the electric field, $H^-$ ions are generated with priority. As a result, a major portion of negative ions are made to be one-atom and monovalent $H^-$ ions. The density of $H^-$ has a peak value in a range from tens $\mu$sec to 100 msec though the foregoing fact cannot generally be applied because foregoing fact depends on the plasma container and generating conditions. At this time, the number of negative ions has been enlarged to be equivalent to the number of positive ions. Collisions with the wall surface and so forth then cause the density of $H^-$ to gradually decrease.

In the period after which the first trigger circuit 45 has been turned off, the density of electrons is extremely lowered. In the period during which the first trigger circuit 45 has been turned off (51) to a moment at which the same is turned on after a lapse of 10 μsec, the second trigger circuit 46 is turned on (53), applying positive bias voltage of 20 kV to 220 kV (54) to the Si substrate in a pulsing manner. The wafer is supplied with positive bias voltage so that negative ions in the plasma 57 are attracted to the wafer 58 and accelerated into deep portions of the wafer. Since the spread of the plasma 57 is larger than the size of the wafer 58, negative hydrogen ions are implanted evenly into the entire surface of the substrate. Therefore, scanning is not required. Although the negative ions are decreased, the positive bias voltage is quickly suspended (first transition 55). Therefore, a lapse of waste time can be prevented.

Again, an operation for turning plasma on (the first transition 48) is performed so that plasma is generated. Then, the plasma is quenched so that the concentration of negative ions is raised, and then positive bias voltage is applied (the first transition 53). The foregoing operations are repeated so that implantation of negative ions H⁻ into the wafer is repeated.

In this embodiment, semiconductor switches are employed to serve as the switches 40 and 43. In the foregoing case, application of a duty 1% and repeated frequency up to several Hz to 10 kHz has been confirmed. Note that a thyratron or the like may be employed as the switching means.

An essential portion of the first embodiment lies in that plasma is turned on/off, H⁻ ions are generated in a large quantity in a period in which the plasma is turned off and positive bias voltage is applied at a specified time to implant H-ions into the Si substrate. The phenomenon that negative ions are increased immediately after plasma has been turned off is thus used advantageously.

Although a high-frequency exciting apparatus has been described, the present invention is not limited to this. The plasma generating means may be microwave plasma or DC discharge plasma in place of the high-frequency plasma. In any case, positive bias voltage is applied to the wafer at the time at which negative ions have been increased immediately after the plasma generating means has been turned off during the operation for periodically turning on/off the plasma generating means.

Second Embodiment (Passing Low-Energy Electrons by Energy Filter)

There are a plurality of methods which are capable of generating negative hydrogen ions in a large quantity. In particular, a multiplicity of results have succeeded in developing a negative hydrogen ion source for a neutron particle injecting apparatus (NBI: Neutral Beam Injection) in developing nuclear fusion. A second embodiment uses the foregoing technique. The structure and operation of the negative hydrogen ion source have been disclosed in "Ion Source Engineering", written by Junzo Ishikawa, Published by Ionics, PP. 486–492.

Hydrogen gas is introduced into a plasma chamber, and then a heat filament disposed in the plasma chamber is energized and heated to generate thermoelectrons. A DC voltage of about 40 V to 100 V is used such that the heat filament is the negative electrode and the wall of the plasma chamber is the positive electrode. Then, DC discharge is caused to occur so that hydrogen plasma is generated. Permanent magnets are disposed on the outside of the plasma generating chamber such that south and north poles are disposed alternately. A multipole (cusp magnetic field) magnetic field is formed so as to efficiently confine plasma.

The plasma chamber is divided into a first plasma chamber and a second plasma chamber by the magnetic field. When electric currents are passed through a plurality of parallel conductive rods, a weak magnetic field of about tens of Gauss is formed. The foregoing structure is called an "energy filter". The energy filter prevents introduction of a large quantity of high-energy electrons with energies of approximately tens of eV generated in the first plasma chamber into the second plasma chamber.

In the second plasma chamber, the plasma therefore contains low-energy electrons of about 1 eV to about 0.1 eV in a large quantity. Dissociative adhesion of electrons to hydrogen molecules causes H⁻ to be generated in large quantities.

Figure 4:
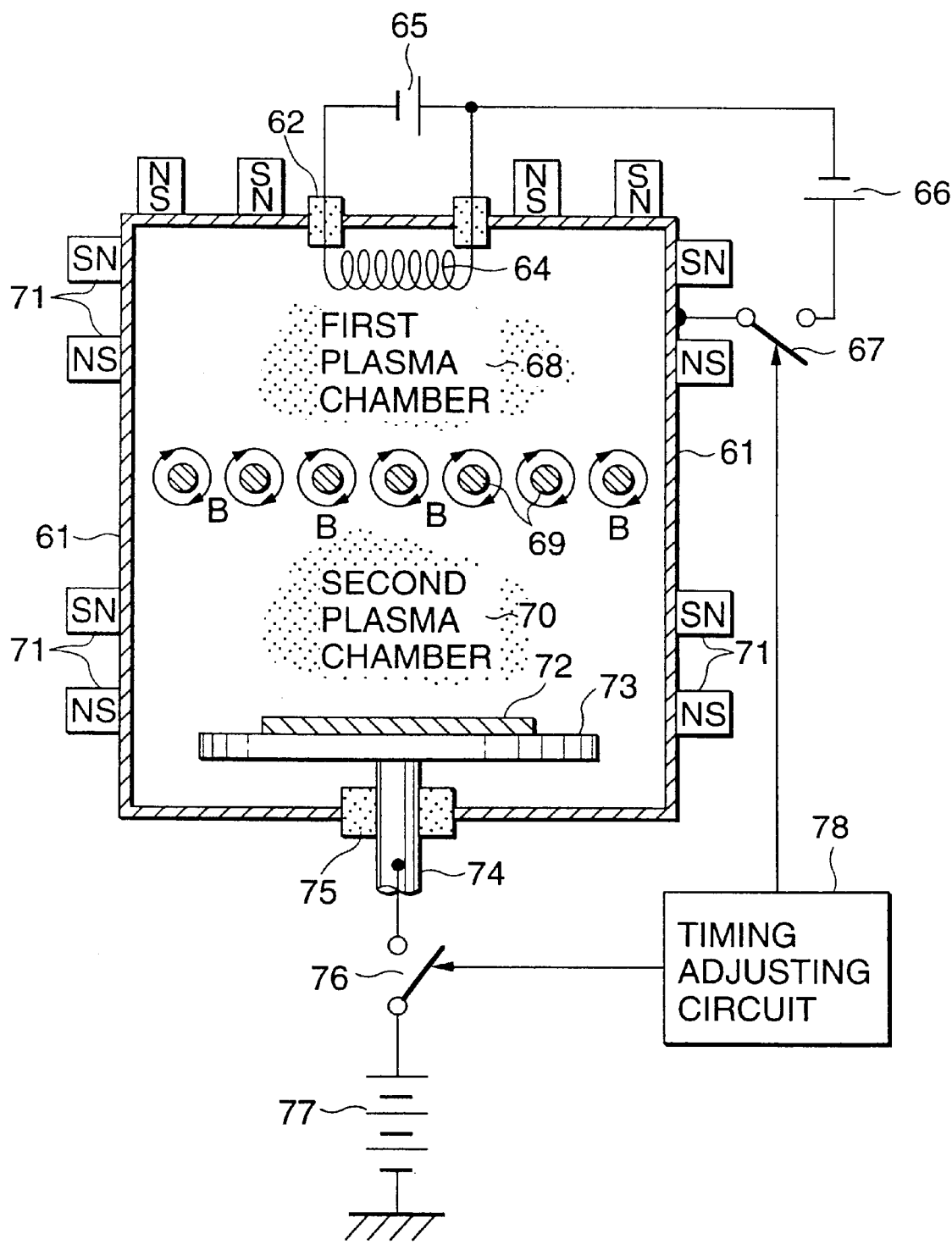
FIG. 4 is a cross sectional view showing an apparatus according to a second embodiment in which a magnetic field is formed in an intermediate portion of a chamber by an ECR plasma method and by supplying electric currents to conductive rods to divide the plasma into two portions to improve the efficiency of generating negative ions so as to implant negative hydrogen ions into the wafer.

FIG. 4 shows the second embodiment in detail. The energy filter increases low-energy electrons to enhance generation of negative ions. Although a heat filament plasma generating apparatus will now be described as an example, the present invention may be applied to any exciting method. A plasma chamber 61 incorporates a gas inlet opening and a gas discharge opening (not shown). Hydrogen gas, argon gas or the like is introduced through the inlet opening. A filament 64 passes through an introduction terminal 62 and is connected to a filament power source 65. An arc power source 66 and a first switch 67 are disposed between the filament 64 and the plasma chamber 61. The filament 64 is heated so as to discharge thermoelectrons. The thermoelectrons flow toward the wall of the plasma chamber 61 so that arc discharge occurs. As a result of the arc discharge, the gas is excited and, thus, plasma is generated.

A plurality of parallel conductive rods 69 are disposed in an intermediate portion of the plasma chamber 61. Electric currents are allowed to flow in the same direction. Thus, a magnetic field of about tens of Gauss to about 100 Gauss is formed around the conductive rods 69. High-energy electrons cannot pass through the barrier in the form of the weak magnetic field. However, low-energy electrons are able to pass through the foregoing barrier. Therefore, the magnetic field formed by the conductive rods 69 serves as an energy filter which permits selective transmission of the low-energy electrons.

The plasma chamber 61 is divided into upper and lower portions by the conductive rods 69. The upper portion is a portion for exciting hydrogen by the heat filament, the upper portion being called a first plasma chamber 68. The lower portion is a portion for generating negative ions, the lower portion being called a second plasma chamber 70. A susceptor 73 on which a wafer 72 has been mounted is disposed in the second plasma chamber 70. The susceptor 73 is connected to an external circuit through a shaft 74. The shaft 74 is connected to a second switch 76 and a positive bias power source 77. The timing adjusting circuit 78 switches on/off the first switch 67 and the second switch 76 in a pulsing manner at timing as shown in FIGS. 3A and 3B.

The positive bias voltage is appropriately determined to enable hydrogen to be implanted into a Si wafer. Usually, about 20 keV to about 220 keV is employed to realize the depth of the implantation. The timing adjusting circuit 78 switches on/off the second switch 76. When the second switch 76 has been switched on, the wafer is biased to positive voltage. Therefore, negative hydrogen ions are implanted into the wafer. Since the wafer is smaller than the spread of the plasma, negative hydrogen ions can be implanted into the entire surface at once. Since the plasma has a large area, beam scanning is not required.

A multiplicity of permanent magnets 71 are disposed on the outer wall in the lower portion of the plasma chamber 61 such that south and north poles of adjacent magnets are inverted alternately. The adjacent magnets generates a cusp magnetic field so that an effect is obtained in that charged particles are confined in the central portion of the plasma chamber.

The operation of the embodied apparatus will now be described. Hydrogen gas is introduced through the gas inlet opening. The filament causes thermoelectrons to be discharged so that arc discharge occurs. As a result, the gas is excited so that plasma is generated. The plasma contains positive ions, electrons, neutral atoms and molecules. A large quantity of electrons are contained, while the negative ions are contained in a smaller quantity. The electrons have high energy in the range of about 10 eV. Since the electrons are high speed electrons, collision with neutral atoms does not easily occur.

Magnetic field B (tens of Gauss to 100 Gauss) formed by the conductive rods 69 exists in the boundary between the first plasma chamber 68 and the second plasma chamber 70. Charged particles, in particular, high speed electrons cannot pass through the barrier in the form of the magnetic field. Neutral atoms and molecules are able to pass through the magnetic field B. Even light-weight electrons of a type having low energy (about 1 eV or lower) are able to pass through the magnetic field B of the conductive rods 69. Low-energy electrons are captured by the magnetic field to perform cyclotron movements. Then, the low-energy electrons are removed from the influence of the magnetic field.

Since low-energy electrons exist in the second plasma chamber 70, the low-energy electrons dissociatively adhere to neutral hydrogen molecules. As a result, negative hydrogen ions are generated. A major portion of the low-energy electrons are allowed to adhere to the neutral atoms and molecules so that the low-energy electrons are quenched. The density of negative ions is therefore raised maximally. At this time, positive bias voltage is applied to the wafer 72 and the suscepter 73 so that negative ions are strongly attracted by electrostatic force.

In the second embodiment, hydrogen gas is supplied to only the first plasma chamber 68. The present invention is not limited to this. In general, the efficiency to generate negative ions can be raised as the pressure of the hydrogen gas is raised. To improve the efficiency to generate negative ions, hydrogen gas may be supplied to also the second plasma chamber 70. Supply of hydrogen gas to the first plasma chamber may be inhibited and supply of the hydrogen gas to only the second plasma chamber 70 may be permitted.

When the positive bias is turned off 56, wafer is exposed to positive ions. The foregoing state does not raise any problem. Simple contact of the positive ions does not cause the same to be introduced into the wafer. In this embodiment, the timing adjusting circuit 78 intermittently excites the plasma. After a short lapse of time from the moment at which the plasma has been turned off, positive voltage is applied to the wafer 72 in a pulsing manner. When the density of the negative ions has been raised, the wafer is biased to the positive voltage so that negative ions are effectively implanted into the wafer.

Third Embodiment (Low-Energy Electrons are Passed by Energy Filter)

Figure 5:
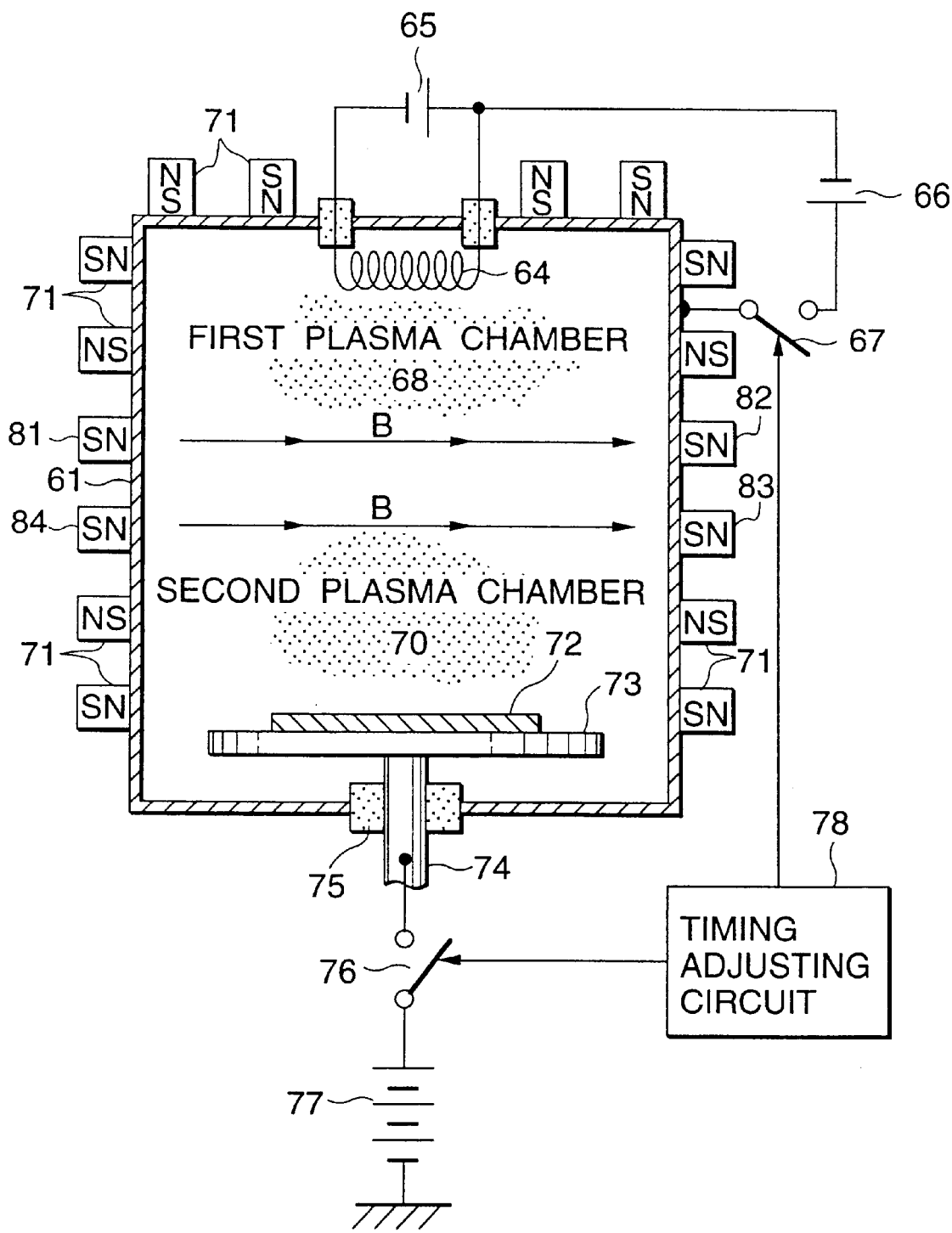
FIG. 5 is a cross sectional view showing an apparatus according to a third embodiment in which a magnetic field is formed in an intermediate portion of a chamber by an ECR plasma method and by supplying electric currents to conductive rods to divide the plasma into two portions to improve the efficiency of generating negative ions so as to implant negative hydrogen ions into the wafer.

FIG. 5 shows a third embodiment. This embodiment is structured such that the energy filter is composed of permanent magnets 81 to 84 which are substituted for the conductive rods. In addition to the permanent magnet 71 for forming the cusp magnetic field, permanent magnets 81 to 84 facing the same direction are disposed at an intermediate height in the plasma chamber 61. Flux densities B directed into one direction are formed between the permanent magnets 81 and 82 and between the permanent magnets 83 and 84. The flux density B interrupts high-speed electrons, that is, serves as the energy filter. Thus, the same effect as that obtainable from a structure in which electric currents are passed through the conductive rods shown in FIG. 4 can be obtained. The permanent magnet 71 disposed in the lower portion generates a cusp magnetic field. The structure in which when the wafer 72 is biased with intermittent positive electric power, negative ions are implanted similarly to the foregoing embodiment. Since negative ions are implanted into the overall surface in one operation, mass separation and beam scanning are not required.

Fourth Embodiment (ECR Plasma Apparatus)

Figure 6:
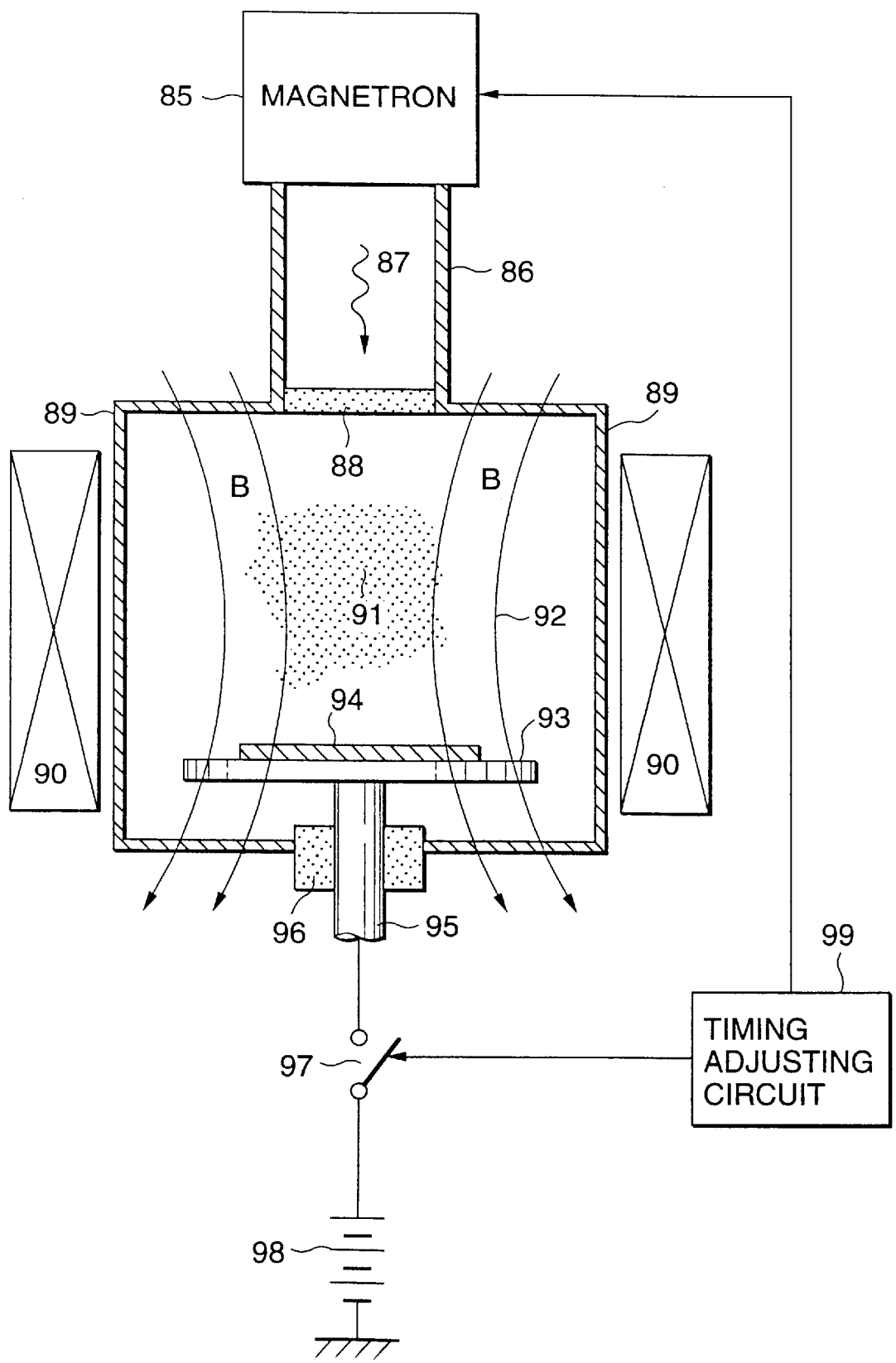
FIG. 6 is a cross sectional view showing an apparatus according to a fourth embodiment employing the ECR plasma method to implant negative hydrogen ions into the wafer.

FIGS. 4 and 5 show the heat filament plasma apparatuses. FIG. 6 shows an ECR microwave plasma apparatus which uses a vertical magnetic field formed by an ECR coil in place of the cusp magnetic field which performs the confining operation.

Microwaves 87 generated by a magnetron 85 transmit in a wave guide pipe 86. The microwaves 87 pass through a dielectric-material window 88. The plasma chamber 89 incorporates a gas inlet opening (not shown) and a gas outlet opening (not shown) and uses the microwave to excite the gas to plasma. A coil 90 is disposed around the plasma chamber 89. The coil 90 generates a vertical magnetic field 92 in plasma 91 in the plasma chamber 89. Electrons perform cyclotron movements by dint of the magnetic field of the coil. In a region in which the frequency of the cyclotron and the frequency of the microwave are the same, resonant absorption (ECR) of the microwave occurs. Therefore, the density of the plasma is raised. A wafer 94 supported by a susceptor 93 is disposed in the plasma chamber 89. The plasma 91 and the entire surface of the wafer 94 are brought into contact with each other. A switch 97 and a positive bias power source 98 are connected to the susceptor 93. A timing adjusting circuit 99 periodically switches the switch 97 on/off. After an appropriate time delay, also the magnetron 85 is turned on/off at the same timing as that shown in FIGS. 3A and 3B.

The magnetron 85 is operated in the pulsing manner. In response to this, the plasma is turned on. After the plasma has been quenched, the density of negative ions is raised. In synchronization with this, the wafer 94 and the susceptor 93 are biased to a positive potential. As a result, negative hydrogen ions H⁻ are implanted into the Si wafer. Since the entire surface of the substrate is contacted with the plasma, negative hydrogen ions can be implanted into the entire surface in one operation. Since only one type of negative ion is generated, mass separation is not required. Since the diameter of the beam is not reduced, the scanning mechanism is not required.

Fifth Embodiment

Figure 7:
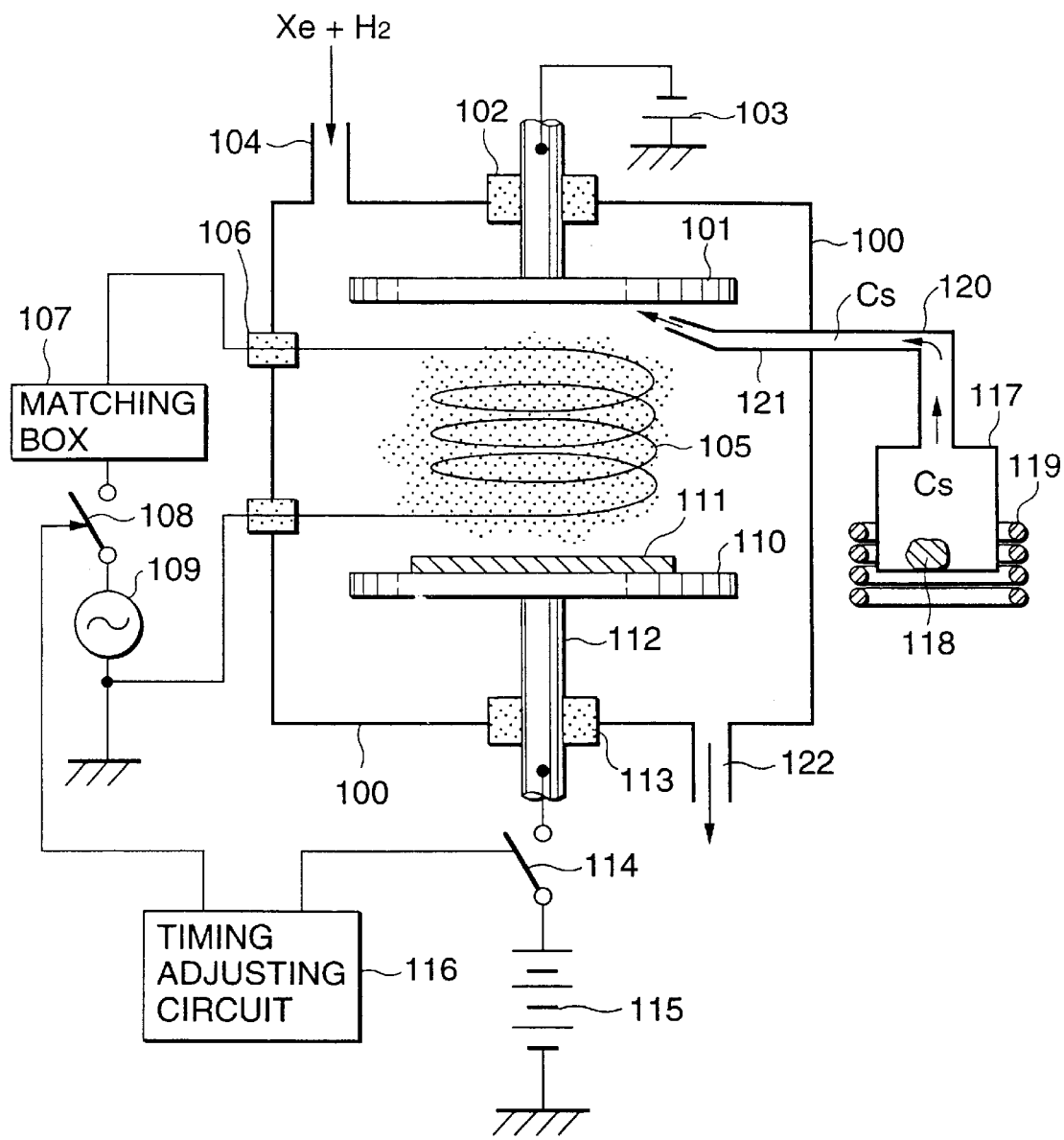
FIG. 7 is a cross sectional view showing a fifth embodiment structured to use a sputtering-type negative ions source to implant negative hydrogen ions into the wafer.

FIG. 7 shows a fifth embodiment. In this embodiment, a sputtering-type negative ion source using cesium is employed. The sputtering-type negative ion source using cesium has been disclosed in, for example, "Characteristic for Extracting Oxygen and Fluorine Negative Ions from RF Plasma Sputtering Type Negative Heavy Ion Source", Tetsuo Tomioka, Hiroshi Tuji, Yoshikata Toyoda, Yasuhito Goto and Junzo Ishikawa, Proc, BEAMS 1995, TOKYO, pp. 191–194.

A conductive target 101 is disposed in the upper portion of plasma generating chamber 100. A shaft of the target 101 is allowed to pass through an insulating member 102 so as to be discharged to the outside and connected to a negative bias power source 103. A raw material gas is supplied through a gas inlet opening 104. A high-frequency coil 105 with several turns is disposed in the plasma generating chamber 100. The terminals of the high-frequency coil 105 are allowed to pass through an insulating member 106 so as to be discharged to the outside. One end of the terminal is allowed to pass through a matching box 107 and a first switch 108 so as to be connected to a high-frequency power source 109. The other end of the high-frequency power source 109 is grounded. The second end of the high-frequency coil 105 is also grounded. A suscepter 110 and a wafer 111 are disposed in the lower portion of the plasma generating chamber 100. A shaft 112 is allowed to pass through an insulating member 113 so as to be extended to the outside. The shaft 112, the suscepter 110 and the wafer 111 are connected to a second switch 114 and a positive bias power source 115. The positive bias power source 115 supplies accelerating energy of 20 keV to 220 keV to the hydrogen ions in the plasma. A timing adjusting circuit 116 switches the first and second switches 108 and 114 on and off in a pulsing manner with timing as shown in FIGS. 3A and 3B.

An oven 117 is disposed on the outside of the plasma generating chamber 100. Cesium (Cs) 118 is accommodated in the oven 117. A heater 119 disposed around the oven is able to heat the oven. A pipe 120 is disposed on the oven 117. A nozzle 121 disposed at the leading end of the pipe is disposed to face the lower surface of the target 101. When Cs is heated by the heater 119, steam is generated which is jetted from the nozzle 121 so as to be allowed to adhere to the surface of the target 101. A gas discharge opening is formed downstream of the drawing electrodes to permit reduction of the inner pressure to a vacuum. The operation of the foregoing structure will now be described.

Negative voltage of about 300 V to 800 V is applied to the target 101. Steam of cesium is generated from the oven 117 so as to be allowed to adhere to the target 101. A mixture of sputtering gas of argon (Ar), xenon (Xe) or the like and hydrogen gas is introduced into the plasma generating chamber 100. A portion of the hydrogen molecules is adsorbed to the surface of the cesium layer of the target. The first switch 108 is closed so that high-frequency voltage is applied to the high-frequency coil 105. The high frequency vertically oscillates electrons in the gas so as to collide with Cs atoms so that electrons are ionized. Therefore, a plasma of the mixture gas (Xe+H) is generated. The plasma is an aggregation of electrons, positive ions, neutral radicals and neutral molecules.

Since the negative voltage has been applied to the target 101, positive ions, such as $Xe^+$ ions, of the inert gas of the mixture are attracted to the target. Positive ions of the inert gas are collided with hydrogen molecules of the target so that the target is sputtered. The hydrogen molecules remove electrons from Cs and decompose so that one-atom negative ions $H^-$ are formed. Since Cs is employed, the density of the negative ions can be raised. Although the negative hydrogen ions can be generated using this method, a preferred embodiment of the present invention employs the method described in the first embodiment. The timing adjusting circuit 116 biases the wafer 111 to positive voltage immediately after supply of electric power to the high-frequency coil in the pulsing manner.

When high frequency is supplied to the high-frequency coil 105, the high frequency strongly moves electrons so that plasma is generated. When supply of the high frequency is interrupted, electrons lose kinetic energy. Thus, the possibility of the collision with neutral hydrogen molecules is increased. A major portion of low-speed electrons become bonded to neutral hydrogen so as to be converted into negative ions. In particular, adjustment of the quantity of Cs which is added enables monopoly generation of $H^-$. At this time, the positive bias voltage is applied to the wafer, negative ions can efficiently be implanted into the wafer, The foregoing method has a problem in that Cs on the Si substrate or Cs implanted into a short distance must be removed. However, the advantage of the method is that the efficiency of generating negative ions can be improved. Negative hydrogen ions are implanted into the substrate (the Si wafer) during the interruption of the discharge (51 shown in FIGS. 3A and 3B). Since the plasma maintains the neutral state on the whole, positive ions collide with the wall and so forth of the plasma generating chamber. The positive ions collide with the target covered with cesium so that the density of the negative ions is furthermore raised. Since electrons are supplied from the negative bias power source 103, the negative ions can be generated at a high density.

Figure 8:
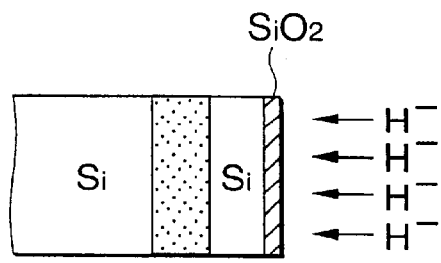
FIGS. 8(1)–8(6) are diagrams showing a process for manufacturing a SOI substrate by implanting negative hydrogen ions into a Si substrate to form a porous layer of hydrogen, followed by allowing other Si to adhere to remove Si from the porous layer.
Figure 8:
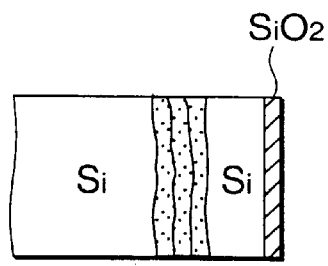
Figure 8:
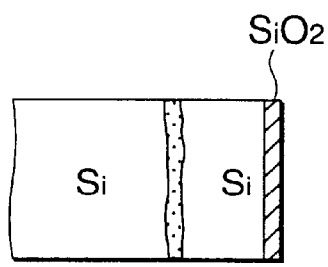
Figure 8:
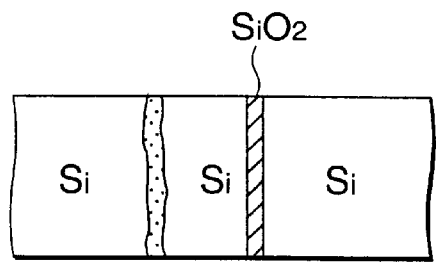
Figure 8:
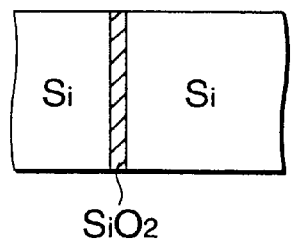
Figure 8:
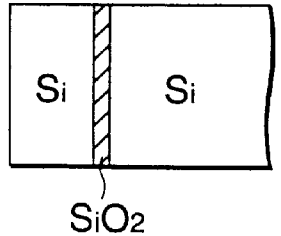
Figure 9:
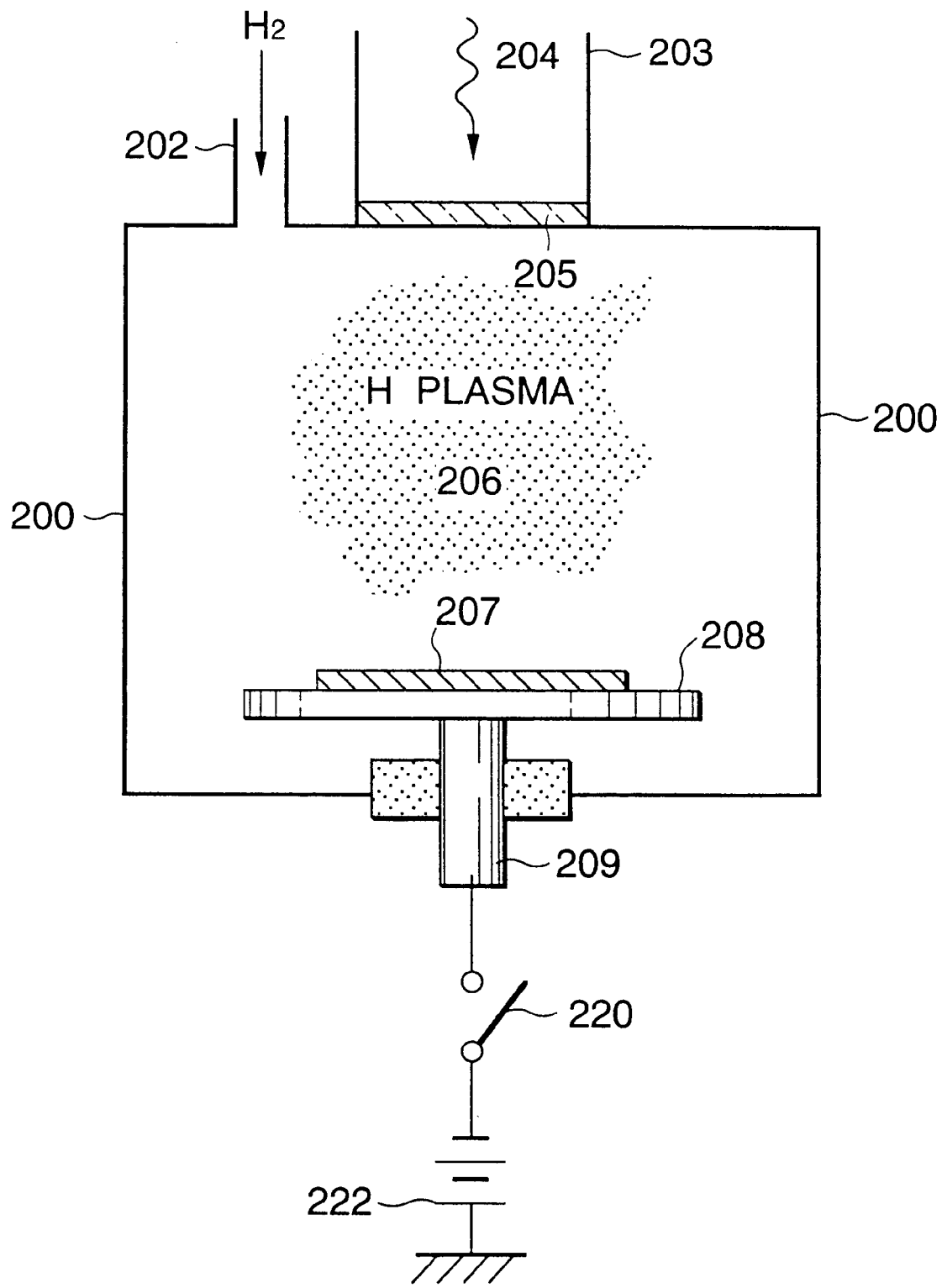
FIG. 9 is a cross sectional view showing a conventional method for implanting positive hydrogen ions to the entire surface of a substrate in one operation.

FIGS. 8(1)–8(6) show a process according to the present invention in which negative hydrogen ions are implanted into the Si substrate to form a porous film made of hydrogen. Then, other Si ions are allowed to adhere to the porous film so as to separate Si so that a SOI substrate is manufactured. Briefly, (1) the surface of a first Si substrate is oxidized so that a $SiO_2$ film is formed. Then, (2) negative hydrogen ions are implanted so that the porous layer having great porosity is formed. Then, (3) heat treatment is performed so that damage of the surface Si layer caused from the implanting operation is restored. Then, (4) the first Si substrate is bonded. Then, (5) shearing force is imparted in the vertical direction so that the first substrate is cut at the porous layer. Then, (6) the surface is polished. Thus, the SOI substrate can be manufactured.

Negative hydrogen ions are implanted into a substrate made of a semiconductor, metal or an insulating material so that hydrogen is buried to a predetermined depth. Since the ions are implanted in a state in which the entire body of the substrate made of the semiconductor, metal or the insulating material is contacted with the plasma, ions can collectively be implanted into the entire surface of the substrate. Only $H^-$ of the negative hydrogen ions can be generated in a monopoly manner by adjusting the plasma parameters. When positive plasma bias voltage is periodically applied to the substrate, only $H^-$ can stably be implanted in a short time and in a required quantity. The necessity of providing the mass separating system can be eliminated. Since a large apparatus for performing the mass separation is not required, the cost of the apparatus can be reduced. Moreover, the area required to install the apparatus can be reduced. Since the mass separation is not performed, the necessity of reducing the diameter of the beam can be eliminated. Moreover, scanning is not required. Since collective implantation is performed without performing scanning, the throughput can be improved.

Moreover, the plasma generating means is periodically turned on/off to apply positive bias plasma to the substrate in a period in which the plasma generating means is turned off. Overheat of the substrate caused from excessive irradiation of electrons and enlargement of the capacity of the plasma bias power source can be prevented. Therefore, a low-cost, stable ion implanting apparatus requiring a small installation area can be provided.

Sixth Embodiment (Passing Low-Energy Electrons by Energy Filter)

There are a plurality of methods which are capable of generating negative hydrogen ions in a large quantity. In particular, a multiplicity of results have been obtained in developing a negative hydrogen ion source for a neutral particle injecting apparatus (NBI: Neutral Beam Injection) in developing nuclear fusion. A sixth embodiment uses the foregoing technique. The structure and operation of the negative hydrogen ion source have been disclosed in "Ion Source Engineering", written by Junzo Ishikawa, Published by Ionics, PP. 486–492.

Hydrogen gas is introduced into a plasma chamber, and then a heat filament disposed in the plasma chamber is energized and heated to generate thermoelectrons. A DC voltage of about 40 V to 100 V is used such that the heat filament is the negative electrode and the wall of the plasma chamber is the positive electrode. Then, DC discharge is caused to occur so that hydrogen plasma is generated. Permanent magnets are disposed on the outside of the plasma generating chamber such that south and north poles are disposed alternately. A multipole (cusp magnetic field) magnetic field is formed so as to efficiently confine plasma.

The plasma chamber is divided into a first plasma chamber and a second plasma chamber by the magnetic field. When electric currents are passed through a plurality of parallel conductive rods, a weak magnetic field of about tens of Gauss is formed. The foregoing structure is called an "energy filter". The energy filter prevents introduction of a large quantity of high-energy electrons of about tens of eV generated in the first plasma chamber into the second plasma chamber.

In the second plasma chamber, the plasma which has passed through the energy filter contains low-energy electrons of about 1 eV to about 0.1 eV in a large quantity. Dissociative adhesion of electrons to hydrogen molecules causes H⁻ to be generated in a large quantity.

When voltage having the illustrated polarity is applied to a multi-aperture electrode system disposed between the second plasma chamber and the Si substrate, negative hydrogen ion beams are extracted. The negative hydrogen ion beam is imparted with energy of about 10 keV to 100 keV so that negative hydrogen ions are implanted to a required depth. At least one of the multi-aperture electrodes is provided with a magnetic field forming means to remove electron beams which are mixed with the negative ion beams by forming a weak magnetic field of about tens of Gauss to several hundreds of Gauss in the beam extracting space.

Figure 10:
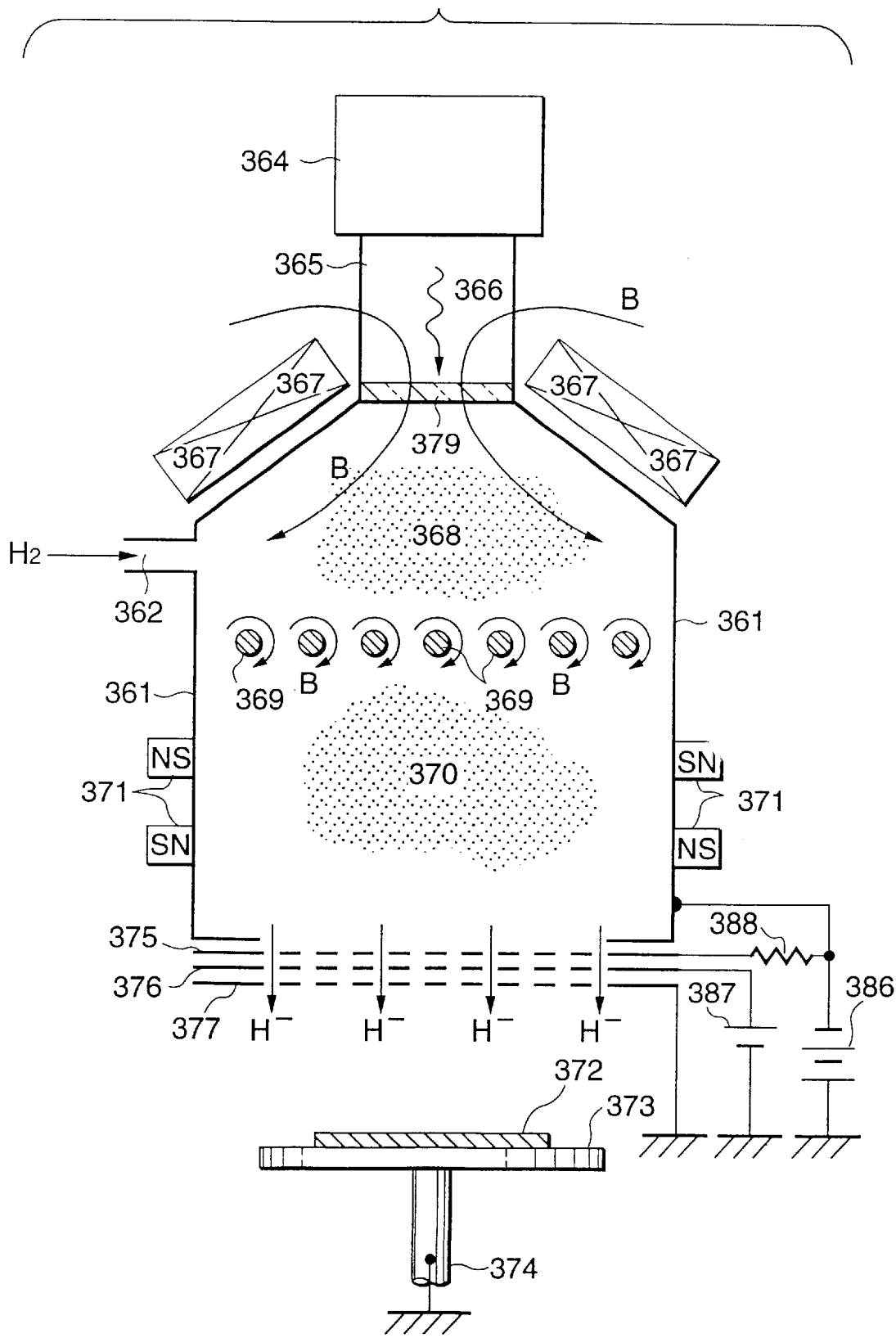
FIG. 10 is a cross sectional view showing an apparatus according to a sixth embodiment for generating a magnetic field in an intermediate portion of a chamber by using electric current of conductive rods by an ECR plasma method to divide plasma into two portions so as to improve a ratio at which negative ions are generated so that negative ion beam is extracted by the extracting electrode system so as to implant negative hydrogen ions into a wafer.

FIG. 10 shows the sixth embodiment in detail. The energy filter increases low-energy electrons to enhance generation of negative ions. Although an ECR plasma generating apparatus will be described, the present invention may be applied to another excitation method. A plasma chamber 361 incorporates a gas inlet opening 362. The magnetron 364 generates microwaves 366. The microwave 366 are allowed to pass through a waveguide pipe 365 and a dielectric window 379 so as to be introduced into the plasma chamber 361. A coil 367 generates a magnetic field which satisfies the ECR condition. When the microwave is 2.45 GHz, a 875-Gauss flux density is realized. Thus, electrons resonant-absorb the microwave.

The plasma chamber 361 incorporates, in an intermediate portion thereof, a plurality of parallel conductive rods 369 so as to be supplied with electric currents in the same direction. Thus, a magnetic field of 10 Gauss to tens of Gauss is formed around the conductive rods 369. The magnetic field is formed in the direction of the envelope. That is, magnetic flux density B is generated in the horizontal direction. Electrons perform spiral movements around the horizontal magnetic field. Although the period of the spiral movements does not depend on the energy of the electron, the radius of the same is in proportion to the square of the energy. Since the Faraday force is in proportion to velocity of the electrons, the Faraday force is enlarged in the case of high energy electrons. The high-energy electrons cannot pass through a barrier realized by the weak magnetic field. Low-energy electrons are able to pass through the foregoing barrier. Therefore, the magnetic field formed by the conductive rods 369 serves as an energy filter for permitting selective penetration of only low-energy electrons.

The plasma chamber 361 is vertically divided by the conductive rods 369. An upper portion is a portion for resonant-absorbing microwaves, the upper portion being called a first plasma chamber 368. A lower portion is a portion for generating high levels of negative ions, the lower portion being called a second plasma chamber 370. The lower portion of the second plasma chamber 370 is open. Three extracting electrode systems are disposed below the opening. The accelerating electrode 375, the decelerating electrode 376 and the ground electrode 377 are disposed, each of which have a multiplicity of openings for extracting ion beams. The foregoing electrodes are multi-aperture electrode plates. To extract ion beams from the multi-aperture extracting electrode systems 375, 376 and 377, ion-beam penetration openings are formed at the same positions. A suscepter 373 on which a Si wafer 372 is mounted is disposed at the forward position of the electrode. The suscepter 373 is supported by the shaft 374. The voltage is the ground voltage (the ground potential). The positive electrode of the accelerating power source 386 (Vacc) is grounded, while the negative electrode of the same is connected to the accelerating electrode 375 through a resistor 388. The negative electrode of the accelerating power source 386 is also connected to the plasma chamber 361. Voltage of −Vacc is applied to the plasma chamber 61 and the accelerating electrode 375. Positive voltage is applied to the decelerating electrode 376 by the decelerating power source 387. The potential of the ground electrode 377 is the ground potential. The positive ions are confined in the plasma chamber 361 by dint of the accelerated voltage Vacc. Only the negative ions and electrons are able to pass through the accelerating electrode 375. Accelerated energy of the negative ions is q (Vpz+Vacc). A positive bias voltage is therefore applied to the plasma chamber 361 from the viewpoint of the wafer.

The appropriate positive bias voltage Vacc is decided in accordance with the desired implantation depth of hydrogen into the Si wafer 372. For example, the usual depth is that realized by about 10 keV to about 100 keV. Negative ion beams of H⁻ emitted from the multi-aperture extracting electrode systems 375, 376 and 377 are implanted into the Si wafer 372. Since the distribution of the openings of each extracting electrode system is wide, the diameter of the beam is larger than the diameter of the wafer. Therefore, negative hydrogen ions H⁻ can be implanted in one operation. No beam scanning mechanism exists. The reason why scanning is not required lies in that mass separation is not required. Since only one type of negative hydrogen ion is generated, mass separation is not required.

A multiplicity of permanent magnets 371 for confining the plasma are disposed on the outer wall of the lower portion of the plasma chamber 361. The south and north poles are inverted alternately between adjacent magnets. A cusp magnetic field is formed by the adjacent magnets so as to confine charged particles in the central portion of the plasma chamber. In this embodiment, microwaves excite the plasma. As an alternative to this, high frequency discharge or DC discharge may be employed to generate the plasma.

The operation will now be described. Hydrogen gas is introduced through the inlet opening 362. The microwaves 366 are introduced into the plasma chamber 361 through the dielectric window 379. The electrons resonant-absorb microwaves to generate high-density hydrogen plasma in the first plasma chamber 368. The plasma contains positive ions, electrons, neutral atoms and molecules. A large quantity of electrons is contained, while the quantity of negative ions is relatively small. The electrons have a high energy of about 10 eV.

A magnetic field B (tens of Gauss to one hundred Gauss) generated by the conductive rods 369 exist in the boundary between the first and second plasma chambers 368 and 370. Charged particles, in particular, high-speed electrons cannot pass through the foregoing magnetic field barrier. The neutral atoms and molecules are able to pass through the magnetic field B. Light-weight electrons of a type having a low energy (about 1 eV or lower) are also able to pass through the magnetic field B of the conductive rods 369. Although the low-energy electrons are captured by the magnetic field and, therefore, perform cyclotron movements, the foregoing electrons are removed from the influence of the magnetic field.

The second plasma chamber 370 does not satisfy the ECR conditions. Therefore, plasma is not increased furthermore. Only plasma moved from the first plasma chamber 368 exists in the second plasma chamber 370. That is, the plasma temperature is low. High-energy electrons exist in a small quantity, while low-energy electrons exist in a large quantity. The energy is about 1 eV. Low-energy electrons dissociatively adhere to the neutral hydrogen molecules. Thus, negative hydrogen ions are generated. A major portion of low-energy electrons adhere to the neutral atoms and molecules, thereby quenching the electrons. Therefore, the density of negative ions is high. The negative ion beams are extracted from the foregoing second plasma chamber 370 by the accelerating electrode 375. The accelerating electrode 375 and the decelerating electrode 376 attract negative ions and electrons. Electrons have been decreased and, therefore, the ratio of negative ions to electrons in the beams is high. The electrons implanted into the sample (the wafer) do not attain any advantage, and, in fact, undesirably heat the substrate. Therefore, it is preferable that the ratio of the electrons is low. To this end, the energy filter is disposed at an intermediate height in the plasma chamber 361. It is effective to employ a method of forming a weak magnetic field in the extracting electrode system to remove the electrons.

In the sixth embodiment, hydrogen gas is supplied to only the first plasma chamber 368. The method is not limited to this. In general, the efficiency of generating negative ions can be improved as the pressure of the hydrogen gas is increased. To improve the efficiency of generating negative ions, supply of hydrogen gas also into the second plasma chamber 370 is permitted. Supply of the hydrogen gas to the first plasma chamber may be inhibited, while hydrogen gas may be supplied to only the second plasma chamber 370. In this case, only rare gas is introduced into the first plasma chamber. Some gas is required to generate the plasma.

As shown in the drawing, bias voltages are applied to the accelerating electrode 375 and the decelerating electrode 376 of the extracting electrode systems. As an alternative to this, switches may be disposed among the accelerating electrode, the resistor 388 and the power sources 386 and 387. The switches are opened/closed repeatedly to perform extracting of negative ion beams from the plasma. Since a long time is required to generate the negative ions, extracting is performed intermittently to replenish the negative ions, followed by performing extracting.

In this embodiment, the microwaves are continuously oscillated. Therefore, temporal quenching of the plasma is not employed. Note that the foregoing post-turned-off negative ion beam method may be applied to this embodiment.

Therefore, intermittent oscillation of a magnetron may be performed to turn the plasma on/off in accordance with the timing waveform shown in FIGS. 3A and 3B. The reason for this lies in that the low-speed electrons increase during the OFF period because of the same reason described in the first embodiment. When voltage+Vpd is applied to the accelerating electrode at the timing shown in FIGS. 3A and 3B, negative ion beams can be extracted at a moment at which the density of the negative ions has been raised.

Seventh Embodiment (Passing Low-Energy Electrons by Energy Filter)

Figure 11:
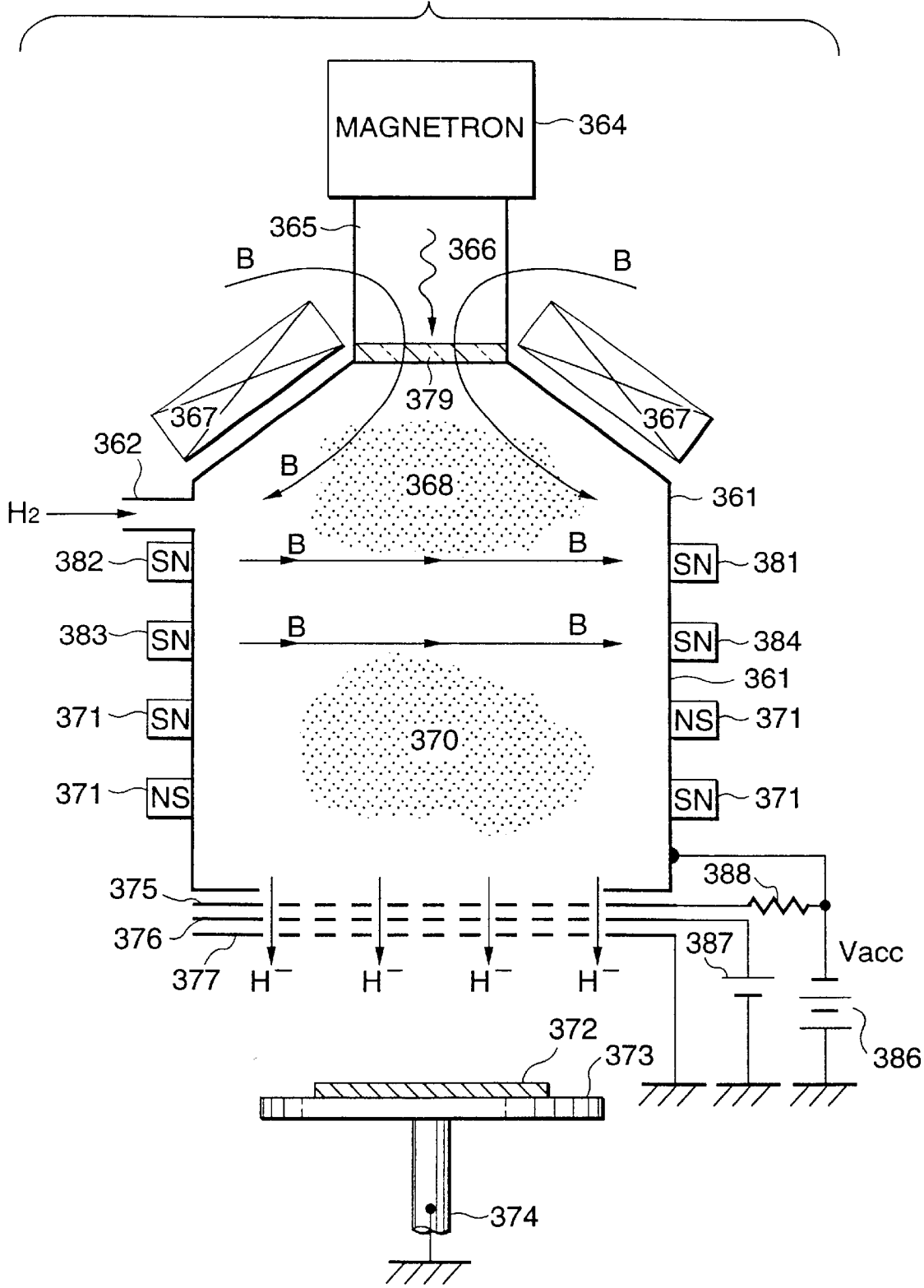
FIG. 11 is a cross sectional view showing an apparatus according to a seventh embodiment structured such that the ECR plasma method is employed to form a magnetic field in an intermediate portion of a chamber by using a magnetic field generated by permanent magnets to divide plasma into two portions so as to improve a ratio at which negative ions are generated so that negative ion beam is extracted by the extracting electrode system so as to implant negative hydrogen ions into a wafer.

FIG. 11 shows a seventh embodiment. This embodiment is structured such that the energy filter is composed of permanent magnets 381 to 384 which are substituted for the conductive rods. In addition to the permanent magnets 371 for forming the cusp magnetic field, permanent magnets 381 to 384 facing the same direction are disposed at an intermediate height in the plasma chamber 361. Flux densities B directed in one direction are formed between the permanent magnets 381 and 382 and between the permanent magnets 383 and 384 disposed such that different poles are opposite to each other. A weak magnetic field of ten to a hundred Gauss is required. The flux density B interrupts high-speed electrons, that is, serves as the energy filter. Thus, the same effect as that obtainable from a structure in which electric currents are passed through the conductive rods shown in FIG. 11 can be obtained. The permanent magnet 371 disposed in the lower portion generates a cusp magnetic field. The extracting electrode system incorporating the accelerating electrode 375, the decelerating electrode 376 and the ground electrode 377 extract the negative ions. The foregoing structure is similar to that according to the sixth embodiment. Since negative ions are implanted into the overall surface in one operation, mass separation and beam scanning are not required.

Eighth Embodiment

Figure 12:
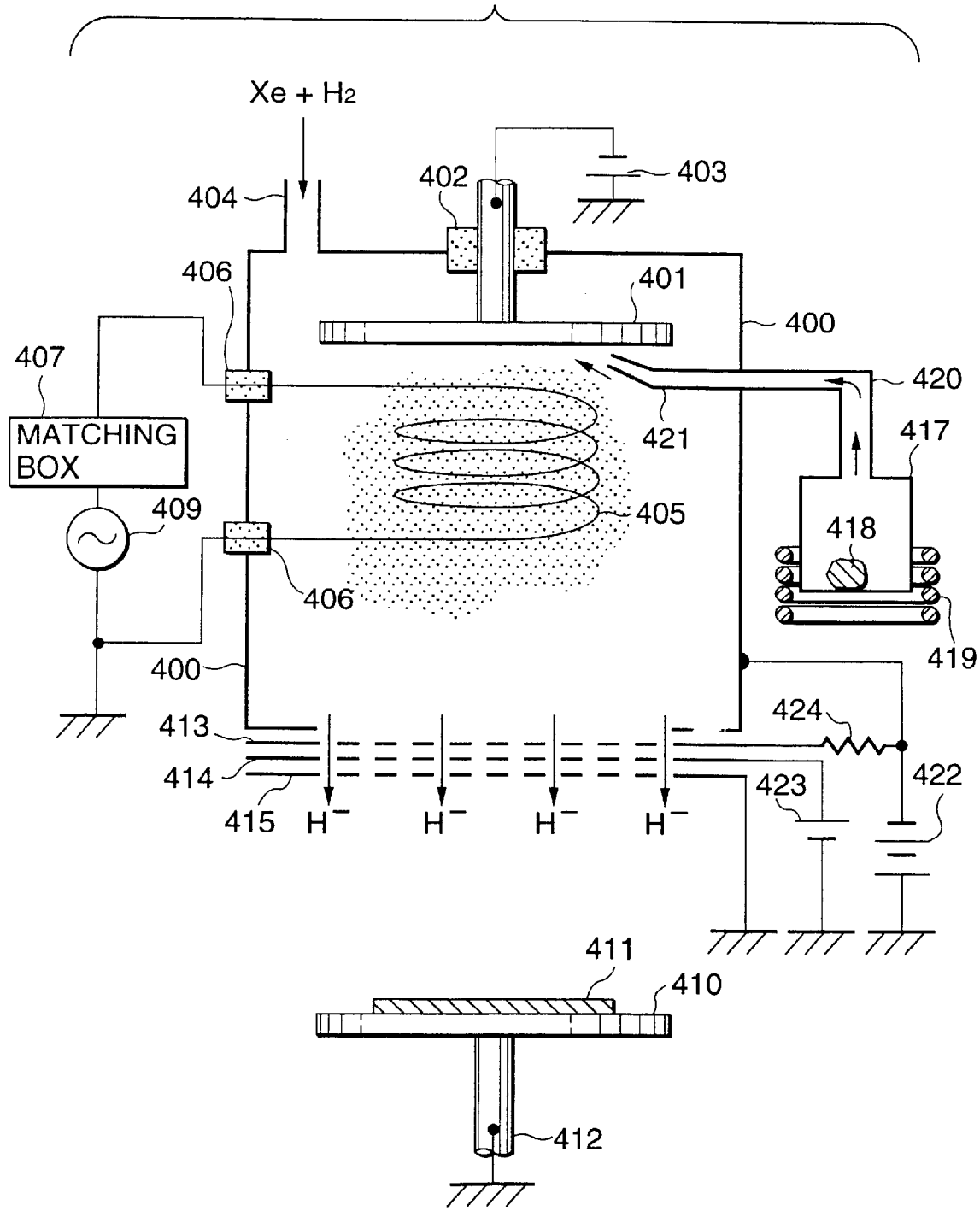
FIG. 12 is a cross sectional view showing an eighth embodiment of the present invention for using a sputtering-type negative ion source using Cs to implant negative hydrogen ions into a wafer.

FIG. 12 shows an eighth embodiment. In this embodiment, a sputtering-type negative ion source using cesium is employed. This type of source has been disclosed in, for example, "Characteristic for Extracting Oxygen and Fluorine Negative Ions from RF Plasma Sputtering Type Negative Heavy Ion Source", Tetsuo Tomioka, Hiroshi Tuji, Yoshitaka Toyoda, Yasuhito Goto and Junzo Ishikawa, Proc. BEAMS 1995, TOKYO, pp. 191–194.

A conductive target 401 is disposed in the upper portion of a plasma generating chamber 400. A shaft of the target 401 is allowed to pass through an insulating member 402 so as to be discharged to the outside and connected to a negative bias power source 403. A raw material gas ($Xe+H_2$) is supplied through a gas inlet opening 404. A high-frequency coil 405 with several turns is disposed in the plasma generating chamber 400. The terminals of the high-frequency coil 405 are allowed to pass through an insulating member 406 so as to be discharged to the outside. One end of the terminal is allowed to pass through a matching box 407 so as to be connected to a high-frequency power source 409. The other end of the high-frequency power source 409 is grounded. The second end of the coil 405 is also grounded.

A wide opening is formed in the lower portion of the plasma generating chamber 400. An extracting electrode system composed of three multi-aperture plates is joined at a forward position, the multi-aperture plates being an accelerating electrode 413, a decelerating electrode 414 and a ground electrode 415. Thus, negative ions are extracted from the plasma generating chamber accelerated. A suscepter 410 and a wafer 411 are disposed in a sealed space (the chamber is omitted from illustration) below the extracting electrode systems 413, 414 and 415. A shaft 412 has a ground potential. The plasma generating chamber 400 is biased to a high negative voltage with respect to the ground by an accelerating power source 412. The voltage level is determined in accordance with the desired depth of implantation of negative hydrogen ions into the substrate, the level being about 20 kV to about 200 kV. For example, negative voltage of 100 kV is applied to the plasma generating chamber. The negative electrode of the accelerating power source 422 is connected to the accelerating electrode 413 through a resistor 424. The same negative voltage as that of the accelerating power source 422 is applied to the accelerating electrode 413. Positive voltage is applied to the decelerating electrode 414 by the decelerating power source 423. The voltage of the accelerating electrode 413 is the same as that of the plasma generating chamber 400. Thus, discharge of positive ion beams to the outside is inhibited. Only the negative ions pass through the openings of the accelerating electrode 413 so as to quickly be accelerated in a space from the decelerating electrode 414.

An oven 417 is disposed on the outside of the plasma generating chamber 400. Cesium (Cs) 418 is accommodated in the oven 417. A heater 419 disposed around the oven is able to heat the oven. A pipe 420 is disposed on the oven 417. A nozzle 421 disposed at the leading end of the pipe is disposed to face the lower surface of the target 401. When Cs is heated by the heater 419, steam is generated which is jetted from the nozzle 421 so as to be allowed to adhere to the surface of the target 401. A gas discharge opening 422 is provided for the plasma generating chamber 400 to permit reduction of the inner pressure to a vacuum. The operation of the foregoing structure will now be described.

Negative voltage of about 300 V to 800 V has been applied to the target 401. Steam of cesium is generated from the oven 417 so as to be allowed to adhere to the target 401. A mixture of sputtering gas, including argon (Ar), xenon (Xe) or the like and hydrogen gas is introduced into the plasma generating chamber 400. A portion of hydrogen molecules is adsorbed to the surface of the cesium layer of the target.

High-frequency voltage is applied to the high-frequency coil 405. The high frequency vertically oscillates electrons in the gas so as to be collide with atoms so that the atoms are ionized. Therefore, plasma of the mixture gas (Xe+H) can be generated. The plasma is an aggregation of electrons, positive ions, neutral radicals and neutral molecules.

Since the negative voltage has been applied to the target 401, positive ions, such as $Xe^+$ ions, of the inert gas are attracted to the target. Positive ions of the inert gas collide with the hydrogen molecules of the target so that the target is sputtered. The hydrogen molecules remove electrons from Cs and decompose so that one-atom negative ions $H^-$ are formed. Since Cs is employed, the density of the hydrogen ions can be raised. $H^-$ ion beams are extracted from plasma containing high-density negative hydrogen ions to irradiate the wafer 411 with the same. Thus, $H^-$ is implanted to a predetermined depth of the wafer.

The foregoing method has a problem in that Cs on the Si substrate or Cs implanted into a short distance must be removed. However, the advantage of the method is that the efficiency of generating negative ions can be improved. Since the negative hydrogen ions are implanted into the wafer, the density of negative ions in the plasma can be lowered. Since the plasma maintains the neutral state on the whole, positive ions collide with the target covered with cesium so as to remove electrons from Cs and supply the electrons to the neutral hydrogen. Thus, negative ions $H^-$ are newly generated in a quantity corresponding to the quenched negative ions.

High-density negative hydrogen ions can be generated by a method in which the high-frequency coil is turned on/off in a pulsing manner. That is, negative hydrogen ions can be implanted continuously. A structure in which a Cs sputtering negative ion source performs the intermittent operation in a pulsing manner is similar to the sixth and seventh embodiments. Although three extracting electrode systems are employed in the first, second and third embodiments, two extracting electrode systems incorporating the accelerating electrode and the ground electrode may be employed.

Ninth Embodiment (Post-Turning-Off Negative Ion Beam Method)

Figure 13:
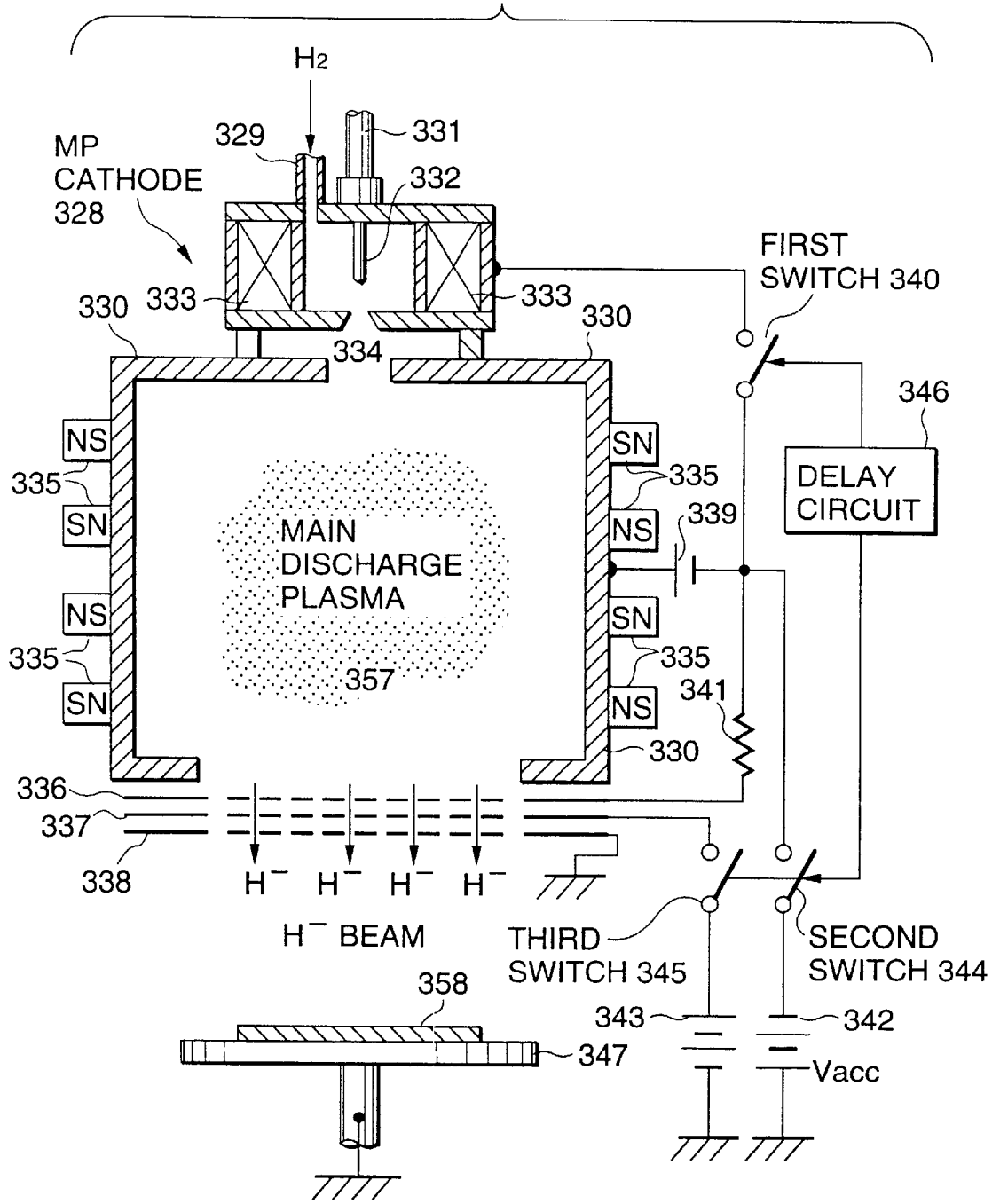
FIG. 13 is a cross sectional view showing an apparatus according to a ninth embodiment of the present invention for generating hydrogen plasma by performing excitation using microwaves and resonant absorption of microwaves using a magnetic field generated by a coil so that introduction of electrons from a microwave source is temporarily interrupted, voltage is applied to an extracting electrode system in a temporal period in which negative ions have been increased after the interruption so as to extract a negative ion beam in order to implant negative hydrogen ions into a Si wafer.

Referring to FIG. 13, a ninth embodiment will now be described. Microwaves are introduced into target chamber through an antenna so that plasma is generated in the chamber. A coaxial cable 331 is connected to an MP cathode chamber 328 having a raw-material-gas inlet opening 329. An antenna 332 is secured to the leading end of the coaxial cable 331. Microwaves generated in a magnetron (not shown) are transmitted in the coaxial cable so as to be introduced into the MP cathode chamber 328 through the antenna 332. Hydrogen gas is introduced into the chamber 328.

A magnetic-field applying unit 333 generates a vertical magnetic field in the MP cathode chamber 328. Thus, a microwave resonant magnetic field is generated. Electrons discharged from hydrogen gas resonant-absorb the microwaves. The movements of the electrons are enhanced so that the hydrogen is struck. Thus, hydrogen plasma is generated which contains positive hydrogen ions and electrons. Rare gas, such as Ar or He, may be added. If no addition is performed, only positive ions are generated and, therefore, the purpose cannot be achieved.

Therefore, a main discharge chamber 330 is formed adjacent to the MP cathode chamber 328. The main discharge chamber 330 has no plasma exciting source. The main discharge chamber 330 is filled with hydrogen plasma created in the MP cathode chamber 328. A multiplicity of permanent magnets 335 having different polarities such that NS, SN, . . . , are joined to the outer wall of the main discharge chamber 330. Thus, a cusp magnetic field is formed in the chamber to prevent collision of charged particles in the plasma with the wall. The foregoing magnetic field is a cusp magnetic field for confining the plasma. An arc power source 339 (Vex) is disposed between the main discharge chamber 330 and the MP cathode chamber 328. The main discharge chamber 330 is biased by the positive voltage of the Vex. As a result, electrons and negative ions are introduced from the MP cathode into the main discharge chamber 330 through the electron discharge opening 334. Electrons impart energy for generating main discharge plasma 357. In addition to the electrons, positive and negative hydrogen ions are moved to the main discharge chamber 330. The electrons in the chamber strike hydrogen so as to generate positive and negative ions. When the energy of the electrons is high, electrons are repelled and positive ions are usually generated. However, when the energy is low, introduction of the electrons into the orbit of hydrogen occurs so that negative ions are usually generated.

When the positive ions are generated, electrons are increased. When the negative ions are generated, electrons are decreased. The electrons are continuously supplied from the MP cathode. The electrons collide with hydrogen atoms and molecules so that the electrons lose the energy. Low-speed electrons are bonded to hydrogen atoms to sometimes generate negative ions. However, a major portion of the low-speed electrons collide with the wall of the main discharge chamber and, therefore, the major portion is quenched.

The main discharge plasma 357 contains positive hydrogen ions, electrons, negative hydrogen ions, neutral hydrogen molecules and neutral atoms. The opposite side of the main discharge chamber 330 is formed into an opening. An extracting electrode system consisting of three multi-aperture plates is disposed at the forward positions of the opening, the three plates being an accelerating electrode 336, a decelerating electrode 337 and a ground electrode 338. The three multi-aperture electrodes are collectively called the "extracting electrode system". Individually, the electrodes are designated as the accelerating electrode, the decelerating electrode and the ground electrode, respectively. The structure is not limited to the triple-electrode system. A double-electrode system may be employed. In this case, the accelerating electrode and the ground electrode are provided and the decelerating electrode is omitted. In the following embodiment, the triple extracting electrode system will be described. The foregoing extracting electrode system extracts, from the main discharge chamber 330, negative ions as beam. An accelerating power source 342 is connected to the accelerating electrode 36 through a second switch 344 and a resistor 341. When the second switch 344 has been closed, the main discharge chamber 330 is biased to high negative voltage. That is, the degree is the difference between accelerated voltage Vacc and extracting voltage Vex (Vacc–Vex) is large. The voltage of the accelerating electrode 336 is –Vacc. The decelerating electrode 337 is connected to the decelerating power source 343 through a third switch 345 so that positive voltage is applied.

In a state in which the second switch 44 and the third switch 345 are closed, a negative ion beam is extracted from the main discharge plasma 357 by dint of the effect of Vacc. When the first switch 340 is closed, electrons and negative ions are introduced from the MP cathode into the main discharge chamber 30. Thus, main discharge plasma 357 containing negative ions in a large quantity is generated. All of the switches 340, 344 and 345 may, as a matter of course, be closed to continuously extract negative ions so as to implant negative hydrogen ions into the Si wafer 358 on the suscepter 347. Since the positive bias effected by the decelerating electrode 337 can be used, only the negative ions and electrons are implanted into the Si wafer 358. Implantation of the electrons, which are not impurities, does not raise a critical problem. As a matter of course, continuous implantation of negative ions is permitted.

If electrons and negative ions are simultaneously implanted, electric power is wasted in a quantity corresponding to the electric current of the electrons. Moreover, heating caused from collision of the electrons cannot be ignored. Therefore, raising of the ratio of the negative ions is required. To raise the ratio, raising and lowering the density of negative ions after the plasma has been turned off is used. To use the foregoing fact, the switches are switched on/off in a pulsing manner, as shown in FIGS. 3A and 3B. FIG. 3A shows timing at which the first switch 340 is switched on/off such that repeated waveforms are formed consisting of OFF 51, first transition 48, ON 49, fall 50 and OFF 51. FIG. 3B shows a waveform of timing at which the second switch 344 and the third switch 345 are switched on/off such that repetition is performed which consists of OFF 56, first transition 53, ON 54 and fall 55. Note that the latter operation is performed with somewhat of a delay.

When the first switch 340 is in the state of fall 50, the state of OFF (52) is maintained. After somewhat of a delay, first transition of each of the second and third switches is performed (53). The foregoing delayed ON/OFF operation is repeated indefinitely.

A delay circuit 346 controls the switching operations of the three switches 340, 344 and 345. When the first switch is closed, the main discharge plasma 357 is formed (ON 49). When the first switch 340 is opened, the temperature of the plasma is rapidly lowered and, therefore, the electrons lose their energy. Although the electrons initially have energies of about 10 eV in the plasma, the energy is reduced to about 1 eV to about 0.1 eV several $\mu$sec after the first switch 340 has been opened. That is, the electrons are converted into low-speed electrons. The low-speed electrons have large cross sectional areas of collision and bonding. The low-speed electrons collide with neutral hydrogen atoms so as to be allowed to adhere and convert the hydrogen atoms into negative ions. Thus, the density of negative ions is raised to a level equivalent to the density of the positive ions. At this time 352, the second and third switches 344 and 345 are closed. As a result, the extracting electrode systems 336, 337 and 338 extract the negative ion beam. Since the density of the negative ions is high, only the negative ions can efficiently be extracted. Since the negative ions are consumed, the extracting voltage is turned off (55). The most preferred delay time T from the fall 50 of the first switch to the first transition 53 of the second switch is about 10 $\mu$sec. Since the pulse operation is repeated, the interval (the delay time) T between 50 and 53 must be 10 $\mu$sec to off-time Toff.

As a result, the electrode is biased to negative only when the main discharge plasma has high-density negative hydrogen ions. Thus, the negative ion beam can be extracted and implanted into the wafer. Although the electron current is not harmful, it can be reduced and a large-current negative ion beam can be extracted when opening/closing is performed at the foregoing timing. In this embodiment, the switches 340, 344 and 345 are semiconductor switches. In the foregoing case, a duty ratio of 1% and repeated frequency of several Hz to 10 kHz are permitted. A thyratron or the like may be employed as the switching means.

An essential feature of the ninth embodiment lies in that plasma is turned on/off to generate H⁻ in a large quantity during the period in which the plasma is turned off. At appropriate timing, a predetermined bias voltage is applied to the extracting electrode system so that H⁻ is implanted into the Si substrate. Thus, the phenomenon of the increase of negative ions occurring immediately after the plasma has been turned off is used advantageously.

Although a high frequency excitation apparatus has been employed, the current invention is not limited to this. Other plasma generating means, including microwave plasma or DC discharge plasma may be employed in place of the high frequency plasma. In any case, the plasma generating means is periodically turned on/off and the predetermined bias voltage is applied to the extracting electrode system at the time at which the negative ions have been increased immediately after the plasma generating means has been turned off. In this embodiment, generation of plasma (the first switch 340) and extracting (the second and third switches) are performed in a pulsing manner to extract the beam only when the density of the negative hydrogen ions is high. This method may also be employed in any of the above embodiments, although detailed description will be omitted.

Negative hydrogen ions are implanted into a semiconductor substrate, a dielectric substrate or a metal substrate so that a layer containing hydrogen in a large quantity can be formed at a predetermined depth. Hydrogen is extracted from the plasma by the extracting electrode system as negative ion beams. Since the diameter of the ion beam is larger than that of the substrate, collective implantation of negative hydrogen ions H⁻ into the surface of the substrate is permitted. Only H⁻ of the negative hydrogen ions is stable so that monopoly generation is permitted. When a predetermined plasma bias voltage is periodically applied to the extracting electrode system, only H⁻ can stably be implanted in a required quantity in a short time. A mass separating system is not required, therefore, a large-size apparatus for performing the mass separation is not required. The cost of the apparatus can thus be reduced, as can the area required to install the apparatus. Since mass separation is not performed, the necessity of reducing the diameter of the beam can be eliminated and scanning is not required. Since scanning is not performed and collective implantation is permitted, the throughput can be improved.

Moreover, the plasma generating means is periodically turned on/off, and then voltage is applied to the extracting electrode system. Thus, only the negative ions can efficiently be extracted. Thus, overheat of the substrate caused from excessive irradiation of electrons and enlargement of the capacity of the power source for the extracting electrode system can be prevented. Therefore, a low-cost, stable ion implanting apparatus requiring a small installation area can be provided.

What is claimed is:

1. A method for implanting negative hydrogen ions comprising the steps of:

generating plasma containing hydrogen;

generating negative hydrogen ions in the plasma;

forming an electric field between the plasma and a substrate using a multi-aperture electrode; and accelerating negative hydrogen ions from the plasma by using the electric field so as to implant negative hydrogen ions into a predetermined depth of a substrate.

2. The method for implanting negative hydrogen ions according to claim 1, wherein one or a plurality of the substrates are disposed, mass separation from the plasma is not performed and negative hydrogen ions are implanted to the overall surface of the one or the plural substrates.

3. The method for implanting negative hydrogen ions according to claim 1, wherein the substrate is heated during or after implantation of the negative hydrogen ions to form voids at the predetermined depth.

4. The method for implanting negative hydrogen ions according to claim 1, wherein the negative hydrogen ions are accelerated by a method of disposing a plurality of drawing electrodes between the plasma and the substrate, and voltage is applied to the plural drawing electrode so as to form an electric field among the drawing electrodes so that the negative hydrogen ions are extracted by the electric field.

5. The method for implanting negative hydrogen ions according to claim 4, wherein the plasma generating is periodically turned on/off.

6. The apparatus for implanting pulse bias negative hydrogen ions according to claim 5, further comprising a mechanism for turning said plasma generating means on/off, and a timing adjusting circuit for determining timing at which generation of the plasma is permitted/inhibited and application of the positive bias to said suscepter is permitted/inhibited;

wherein positive bias voltage is applied to said suscepter immediately after said plasma generating means has been turned off.

7. The apparatus for implanting pulse bias negative hydrogen ions according to claim 5, further comprising a magnetic-field forming means for forming a magnetic field in said plasma chambers which is disposed in said plasma chamber or on the outside of said plasma chamber to divide said plasma chamber into two sections so that penetration of electrons having high energy is prevented by the magnetic field; wherein either of said plasma chambers generates plasma, and said suscepter and the substrate are disposed in the other plasma chamber.

8. The method for implanting negative hydrogen ions according to claim 1, wherein the substrate is exposed to the plasma, the plasma generating is periodically turned on/off, positive pulse voltage is applied to the substrate in a period approximately 10 μsec after a moment at which said plasma generating is turned off to a moment at which said plasma generating is turned on so that negative ions beam in the plasma which is in a quenching state is accelerated so as to be implanted into the substrate.

9. The method for implanting pulse bias negative hydrogen ions according to claim 1, wherein Cs is supplied to a plasma chamber incorporating means for generating plasma by applying high frequency to a high-frequency coil, Cs is disposed on the surface of a conductive target disposed in said plasma chamber, negative voltage is applied to said target to sputter said target with positive ions so that hydrogen plasma containing negative hydrogen ions at a high concentration is generated.

10. The method for implanting pulse bias negative hydrogen ions according to claim 1, wherein said plasma generating means is periodically turned on/off, and the substrate is applied with positive pulse voltage in a period from turning of said plasma generating means off to again turning of said plasma generating means on after a lapse of 10 μsec.

11. The negative hydrogen ion beam implanting method according to claim 1, wherein Cs is supplied to the plasma chamber incorporating means for generating plasma by supplying high frequency to a high-frequency coil, Cs is deposited on the surface of a conductive target disposed in said plasma chamber and negative voltage is applied to the target so that the target is sputtered with positive ions so as to generate hydrogen plasma containing a high concentration of negative hydrogen ions.

12. The negative hydrogen ion beam implanting method according to claim 1, wherein said plasma generating means is periodically turned on/off, and DC voltage is applied to said extracting electrode system in a period from a moment at which said plasma generating means has been turned off to a moment after a lapse of 10 μsec at which said plasma generating means has again be turned on so as to extract the negative hydrogen ion beam.

13. The negative hydrogen ion beam implanting apparatus according to claim 5, further comprising:

a switch for turning on/off said plasma generating means;

a switch for turning on/off generation of plasma and DC voltage which is supplied to said extracting electrode system; and a delay circuit for determining the relationship between timing at which said plasma generating means is turned on/off and timing at which the voltage of said extracting electrode system is turned on/off;

wherein DC voltage is supplied to said extracting electrode system immediately after said plasma generating means has been turned off so as to extract a negative ion beam.

14. An apparatus for implanting negative hydrogen ions comprising:

hydrogen generating means for generating plasma containing hydrogen;

negative hydrogen ions generating means for generating negative hydrogen ions in the plasma; and multi-aperture electrode for forming an electric field between the plasma and a substrate;

wherein negative hydrogen ions from the plasma is accelerated by using the electric field so as to implant negative hydrogen ions into a predetermined depth of a substrate.

15. The apparatus for implanting negative hydrogen ions according to claim 14, wherein one or a plurality of the substrates are disposed, mass separation from the plasma is not performed, and negative hydrogen ions are implanted to the overall surface of the one or the plural substrates.

16. The apparatus for implanting negative hydrogen ions according to claim 14, further comprising heating means for heating the substrate during or after implantation of the negative hydrogen ions to form voids at the predetermined depth.

17. The apparatus for implanting negative hydrogen ions according to claim 14, further comprising a plurality of drawing electrodes between the plasma and the substrate, which accelerates the negative hydrogen ions;

wherein voltage is applied to the plural drawing electrode so as to form an electric field among the drawing electrodes so that the negative hydrogen ions are extracted by the electric field.

18. The apparatus for implanting negative hydrogen ions according to claim 17, wherein the plasma generating means is periodically turned on/off.

19. A method for implanting negative hydrogen ions according to claim 14, wherein the substrate is exposed to the plasma, the plasma generating means is periodically turned on/off, positive pulse voltage is applied to the substrate in a period approximately 10 µsec after a moment at which said plasma generating is turned off to a moment at which said plasma generating is turned on so that negative ions beam in the plasma which is in a quenching state is accelerated so as to be implanted into the substrate.

20. A method for implanting pulse bias negative hydrogen ions to a predetermined depth of a substrate comprising the steps of:

causing plasma generating means to generate plasma containing hydrogen;

exposing a substrate to the hydrogen plasma;

applying positive pulse voltage to the substrate; and generating an electric field between the plasma and the substrate using a multi-aperture electrode so that negative hydrogen ions contained in the plasma are implanted to a predetermined depth of the substrate.

21. The method for implanting pulse bias negative hydrogen ions according to claim 20, wherein a magnetic field for capturing electrons is formed in an intermediate portion of a plasma chamber for generating plasma, the plasma generating means generates plasma in a first plasma chamber in either side of the magnetic field, the substrate is disposed in a second plasma chamber, the magnetic field inhibits movement of high energy electrons to said second plasma chamber, and collisions of electrons, neutron atoms and molecules are enhanced in said second plasma chamber so that the concentration of negative hydrogen ions is raised.

22. The apparatus for implanting pulse bias negative hydrogen ions comprising:

a plasma chamber which is a space for generating plasma capable of being brought to a vacuum state;

plasma generating means for generating plasma in said plasma chamber;

a gas introducing opening for introducing gas containing hydrogen atoms into said plasma chamber;

a gas exhausting unit for exhausting the gas from said plasma chamber;

a multi-aperture electrode for forming an electric field between the plasma and a substrate;

a suscepter which is disposed in said plasma chamber and on which the substrate is placed;

a positive bias power source for applying positive voltage bias to said suscepter;

a switch disposed between said positive bias power source and said suscepter; and a mechanism for applying positive voltage bias to the substrate in a pulsing manner.

23. The apparatus for implanting pulse bias negative hydrogen ions according to claim 22, further comprising a conductive target disposed in said plasma chamber incorporating means for generating plasma by applying high frequency to a high-frequency coil, a negative bias power source for applying negative voltage to said target, an oven for generating steam of Cs, Rb or K, and a nozzle for introducing steam generating by the oven into said target.

24. A negative hydrogen ion beam implanting method for implanting hydrogen ions into a predetermined depth of a substrate, comprising the steps of:

generating plasma containing hydrogen in a plasma chamber by a plasma generating means;

extracting a negative hydrogen ion beam from the plasma by an extracting electrode system incorporating a plurality of multi-aperture electrode plates each having a pore distribution in a range wider than the diameter of the substrate; and implanting the negative hydrogen ion beam into a predetermined depth of the substrate.

25. The negative hydrogen ion beam implanting method according to claim 24, wherein a magnetic field for capturing electrons is formed in an intermediate portion of the plasma chamber for generating the plasma, the plasma is generated by a plasma generating means in a first plasma chamber disposed on either side of the magnetic field, the extracting electrode system is provided for an opening portion of a second plasma chamber so that movement of high-energy electrons in the first plasma chamber is prevented by the magnetic field, collision of low-energy electrons, neutron atoms and molecules is enhanced in said second plasma chamber so as to raise the density of negative ions so that the negative hydrogen ion beam is extracted from said second plasma chamber so that the negative hydrogen ion beam is implanted into the substrate.

26. The negative hydrogen ion beam implanting apparatus comprising:

a plasma chamber which is a space for generating plasma, the pressure can be reduced to a vacuum;

plasma generating means for generating the plasma in said plasma chamber;

a gas introducing opening for introducing gas containing hydrogen atoms into said plasma chamber;

a gas exhaust unit for exhausting gas from said plasma chamber;

a plurality of extracting electrode systems disposed in an opening portion of said plasma chamber and each incorporating a porous plate having a diameter larger than the diameter of a substrate;

a power source for applying high negative voltage and positive voltage to an extracting electrode system to extract the negative ion beam from the plasma; and a suscepter which is disposed downstream of said extracting electrode system and on which a semiconductor substrate, an insulating substrate or a metal substrate is mounted.

27. A negative hydrogen ion beam implanting apparatus according to claim 26, further comprising: a magnetic-field forming means for forming a magnetic field in said plasma chamber, which is disposed in said plasma chamber or on the outside of said plasma chamber to divide said plasma chamber into two sections so that penetration of electrons having high energy is prevented by the magnetic field; wherein either of said plasma chambers generates plasma, and said susceptor and the substrate are disposed in the other plasma chamber.

28. The apparatus for implanting pulse bias negative hydrogen ions according to claim 26, further comprising a conductive target disposed in said plasma chamber incorporating means for generating plasma by applying high frequency to a high-frequency coil, a negative bias power source for applying negative voltage to said target, an oven for generating steam of Cs, Rb or K, and a nozzle for introducing steam generating by the oven into said target.

29. A method for implanting negative hydrogen ions comprising the steps of:

generating plasma containing hydrogen;

generating negative hydrogen ions in the plasma;

forming an electric field between the plasma and a substrate; and accelerating negative hydrogen ions from the plasma by using the electric field so as to implant negative hydrogen ions into a predetermined depth of a substrate;

wherein the substrate is exposed to the plasma, the plasma generating is periodically turned on/off, positive pulse voltage is applied to the substrate in a period approximately 10 $\mu$sec after a moment at which said plasma generating is turned off to a moment at which said plasma generating is turned on so that negative ions beam in the plasma which is in a quenching state is accelerated so as to be implanted into the substrate.

30. A method for implanting negative hydrogen ions comprising the steps of:

generating plasma containing hydrogen;

generating negative hydrogen ions in the plasma;

forming an electric field between the plasma and a substrate; and accelerating negative hydrogen ions from the plasma by using the electric field so as to implant negative hydrogen ions into a predetermined depth of a substrate;

wherein the substrate is exposed to the plasma, the plasma generating means is periodically turned on/off, positive pulse voltage is applied to the substrate in a period approximately 10 $\mu$sec after a moment at which said plasma generating is turned off to a moment at which said plasma generating is turned on so that negative ions beam in the plasma which is in a quenching state is accelerated so as to be implanted into the substrate.

31. A method for implanting negative hydrogen ions comprising the steps of:

generating plasma containing hydrogen;

generating negative hydrogen ions in the plasma;

forming an electric field between the plasma and a substrate; and accelerating negative hydrogen ions from the plasma by using the electric field so as to implant negative hydrogen ions into a predetermined depth of a substrate;

wherein said plasma generating means is periodically turned on/off, and the substrate is applied with positive pulse voltage in a period from turning of said plasma generating means off to again turning of said plasma generating means on after a lapse of 10 $\mu$sec.

* * * * *